(12) United States Patent
Orita et al.

(10) Patent No.: US 7,880,377 B2
(45) Date of Patent: Feb. 1, 2011

(54) QUANTUM DOT-DISPERSED LIGHT EMITTING DEVICE, AND MANUFACTURING METHOD THEREOF

(75) Inventors: Masahiro Orita, Tokyo (JP); Hiroshi Kawazoe, Kanagawa (JP); Satoshi Kobayashi, Tokyo (JP); Hiroaki Yanagita, Tokyo (JP); Morihiro Niimi, Saitama (JP); Yuki Tani, Tokyo (JP); Misaki Hatsuda, Tokyo (JP)

(73) Assignee: Hoya Corporation, Tokyo (JP)

( * ) Notice: Subject to any disclaimer, the term of this patent is extended or adjusted under 35 U.S.C. 154(b) by 510 days.

(21) Appl. No.: 10/587,029

(22) PCT Filed: Jan. 20, 2005

(86) PCT No.: PCT/JP2005/000694

§ 371 (c)(1),
(2), (4) Date: Jul. 24, 2006

(87) PCT Pub. No.: WO2005/071764

PCT Pub. Date: Aug. 4, 2005

(65) Prior Publication Data

US 2008/0122341 A1 May 29, 2008

(30) Foreign Application Priority Data

Jan. 23, 2004 (JP) .............................. 2004-016095

(51) Int. Cl.
*H05B 33/14* (2006.01)
*B32B 5/16* (2006.01)
(52) U.S. Cl. ...................... 313/503; 313/504; 313/507; 445/24; 428/328
(58) Field of Classification Search .......... 313/501–512
See application file for complete search history.

(56) References Cited

U.S. PATENT DOCUMENTS 6,554,808 B1 4/2003 Cook (Continued)

FOREIGN PATENT DOCUMENTS

JP 6-104087 A 4/1994

(Continued)

OTHER PUBLICATIONS

M. Danek et al., "Electrospray organometallic chemical vapor deposition-A novel technique for preparation of II-VI quantum dot composites", Appl. Phys. Lett., vol. 65, No. 22, pp. 2795-2797 (Nov. 28, 1994).

(Continued)

*Primary Examiner*—Sikha Roy
*Assistant Examiner*—Tracie Green
(74) *Attorney, Agent, or Firm*—Sughrue Mion, PLLC

(57) ABSTRACT

A light emitting device having practical light emission characteristics is obtained without epitaxial growth.

A quantum dot-dispersed light emitting device of the invention includes a substrate 11, an electron injection electrode 12, a hole injection electrode 14, and an inorganic light emitting layer 13 disposed so as to be in contact with both the electrodes. The inorganic light emitting layer 13 contains an ambipolar inorganic semiconductor material and nanocrystals 15 dispersed as luminescent centers in the ambipolar inorganic semiconductor material and is configured so as to be capable of light emission without having, at the interface with the electron injection electrode and/or the hole injection electrode, epitaxial relation therewith.

13 Claims, 3 Drawing Sheets

U.S. PATENT DOCUMENTS

| | | | |
|---|---|---|---|
| 2002/0151094 A1* | 10/2002 | Andriessen | 438/29 |
| 2002/0167280 A1* | 11/2002 | Hayashi et al. | 315/169.3 |
| 2003/0042850 A1* | 3/2003 | Bertram et al. | 313/504 |
| 2003/0094897 A1* | 5/2003 | Koyama et al. | 313/512 |
| 2004/0023010 A1* | 2/2004 | Bulovic et al. | 428/209 |
| 2005/0040392 A1* | 2/2005 | Wu et al. | 257/40 |

FOREIGN PATENT DOCUMENTS

| | | |
|---|---|---|
| JP | 2559999 B2 | 5/1996 |
| JP | 2001-203382 A | 7/2001 |
| JP | 2001-210865 A | 8/2001 |
| JP | 2002-198512 A | 7/2002 |
| JP | 2002-246177 A | 8/2002 |
| JP | 2003-137700 A | 5/2003 |
| JP | 2003133057 A | 5/2003 |
| WO | 02/25745 A2 | 3/2002 |
| WO | 03021694 A2 | 3/2003 |
| WO | 03/071608 A1 | 8/2003 |

OTHER PUBLICATIONS

Chinese Office Action dated Dec. 5, 2008.

S. Nakamura et al., "Bright electroluminescence from CdS quantum dot LED structures." Electronic Letters vol. 34 No. 25., Dec. 10, 1998, pp. 2435-2436.

Seth Coe-Sullivan; "Tuning the performance of hybrid organic/inorganic quantum dot light-emitting devices"; 2003; Organic Electronics 4, pp. 123-130.

* cited by examiner

QUANTUM DOT-DISPERSED LIGHT EMITTING DEVICE, AND MANUFACTURING METHOD THEREOF

TECHNICAL FIELD

The present invention relates to a quantum dot-dispersed light emitting device, a manufacturing method thereof, an illumination apparatus, and a display apparatus. More particularly, it relates to a quantum dot-dispersed light emitting device fabricated by dispersing nanocrystals in an ambipolar semiconductor.

BACKGROUND ART

In general, a light emitting diode is fabricated by using a pn junction as a basic structure. Namely, two semiconductors, one controlled to p type, and the other controlled to n type by using dopants, are fabricated, and a structure obtained by joining the semiconductors together is used. In recent years, quantum dots have been dispersed in the pn junction interface or the i layer in a pin junction in order to try to increase luminous efficiency of the light emitting diode having a pn junction as a basic structure.

For example, in Patent Document 1, a light emitting diode in which quantum dots of germanium are dispersed in silicon is proposed and disclosed.

The light emitting device indicates, as shown in FIG. 3, an example of a light emitting diode in which quantum dots of germanium are dispersed in silicon. On an n+ silicon layer 31, a first epitaxial layer 32 is stacked, and quantum dots 35 are formed on the surface. Then, a second epitaxial layer 33 is coated, and further a p+ epitaxial layer is stacked thereon. Thus, a quantum dot-dispersed light emitting diode is configured. Respective layers are formed with epitaxial relation so that the layers are held on the underlayer 31.

The light emitting device is configured such that quantum dots are dispersed in silicon, which is an indirect semiconductor, thereby enhancing the luminous efficiency.

Whereas, Patent Document 2 proposes a light emitting device configured as follows: an i layer is formed on an n layer, and the layer is irradiated with an ion beam and perforated with pores; the pores are filled with a semiconductor having a narrow forbidden band; and then, a p layer is stacked thereon, thereby to fabricate a pin type light emitting diode.

Further, in Patent Document 3, there is also proposed the following method: a group V element different from the group V element of a III-V compound semiconductor is supplied to the III-V compound semiconductor surface, so that substitution occurs between the group V element of the III-V compound semiconductor. The supplied group V element effects strain due to the mismatch of the lattice constant, thereby forming a quantum dot structure. However, even with this method, epitaxial growth is used.

Patent Document 1: Japanese Patent No. 2559999
Patent Document 2: U.S. Pat. No. 6,554,808 B2
Patent Document 3: JP-A-2002-198512

DISCLOSURE OF THE INVENTION

Problems that the Invention is to Solve

Conventionally, in the foregoing pn type or pin type light emitting diode, the pn junction is the basic structure. Therefore, for both the polarities of a p type and an n type, only a semiconductor material controllable in polarity can be used, and a semiconductor not controllable to opposite polarities cannot be used. For example, for a ZnS semiconductor, the n type control is possible, but no p type control has been successfully used. In actuality, the pn junction is difficult to fabricate. In the related art, in the quantum dot-dispersed light emitting diode, quantum dots are dispersed in the pn junction interface or the i layer of the pin structure. Therefore, a quantum dot-dispersed light emitting diode cannot be fabricated by using a semiconductor material not controllable to opposite polarities.

Whereas, even when a semiconductor controllable to opposite polarities is used, a light emitting diode having a practical luminous intensity cannot be fabricated unless the semiconductor is epitaxially grown on a single crystal substrate. Namely, for example, a practical luminous intensity can be obtained only when GaN is heteroepitaxially grown on a sapphire substrate, or ZnSe is homoepitaxially grown on a ZnSe single crystal substrate. There has been no practical light emitting diode fabricated on a substrate that is not crystalline, such as a glass substrate.

Thus, conventionally, epitaxial growth of an inorganic light emitting layer has been the condition for obtaining the luminous intensity. Accordingly, it has not been possible to obtain a light emitting device having practical light emission characteristics without epitaxial growth. However, the conditions for epitaxial growth impose a restriction on the substrate material. Further, the materials that can be deposited on a substrate by epitaxial growth also are restricted. Thus, it has been difficult to obtain a practically available light emitting device.

The invention has been completed in view of the foregoing circumstances, and it is an object of the invention to provide a light emitting device having practical light emission characteristics without epitaxial growth.

Means for Solving the Problems

Thus, a quantum dot-dispersed light emitting device of the present invention is characterized by including: a substrate; an electron injection electrode; a hole injection electrode; and an inorganic light emitting layer disposed so as to be in contact with both the electrodes, wherein the inorganic light emitting layer includes an ambipolar inorganic semiconductor material and nanocrystals dispersed as luminescent centers in the ambipolar inorganic semiconductor material. The inorganic light emitting layer is configured without having, at the interface with the electron injection electrode and/or the hole injection electrode, epitaxial relation therewith.

The invention was made by focusing attention on the following fact. An ambipolar inorganic semiconductor material is used as a light emitting layer. In the light emitting layer, nanocrystals with selected size, density, dispersed state, and the like are included as luminescent centers, and the hole injection electrode and the electron injection electrode are selected. As a result, it is possible to obtain a semiconductor apparatus high in luminous efficiency without causing epitaxial growth thereof.

The phrase "epitaxial growth" denotes that on a single crystal substrate or a single crystal film, a film is grown by a deposition process, a sputtering process, or the like to form a single crystalline thin film. Whereas, the phrase "having epitaxial relation" denotes the relation between single crystalline films or both the crystal axes when the single crystalline thin film is epitaxially grown on the single crystalline film.

In this semiconductor apparatus, when a positive electrical potential relative to the electrical potential of the electron injection electrode is applied to the hole injection electrode, electrons from the electron injection electrode and holes from the hole injection electrode are injected respectively into the inorganic light emitting layer. The electrons and the holes in the inorganic light emitting layer both flow into the nanocrystals and are recombined with each other in the nanocrystals to emit light with a wavelength corresponding to the energy difference between the recombination levels in the nanocrystals.

Herein, the electrons and the holes, which are light emission sources, are all externally injected to the light emitting layer through the electron injection electrode and the hole injection electrode, respectively, and hence, the pn junction is not required.

The emission wavelength from the light emitting device (light emitting diode) of the invention can be arbitrarily selected from across the ultraviolet to infrared region by controlling the material and the grain size of the nanocrystals (quantum dots) forming the luminescent centers. For this reason, light with a wavelength over a wide region from ultraviolet to infrared can be emitted with good monochromatism.

With this configuration, the inorganic light emitting layer is configured to include an ambipolar inorganic semiconductor material formed without having, at the interface with the electron injection electrode or the hole injection electrode, epitaxial relation therewith. Therefore, the inorganic light emitting layer can be formed easily without selecting the substrate, which enables the formation of a light emitting device with high luminous intensity. Then, a semiconductor light emitting device is configured including a two-terminal type light emitting device, i.e., a light emitting diode, including an electron injection electrode, a hole injection electrode, and a light emitting layer disposed to be in contact with both the electrodes, configured to include an ambipolar inorganic semiconductor material having both the electron transportability and the hole transportability, and containing nanocrystals serving as luminescent centers.

Therefore, the semiconductor light emitting device of the invention can also use a glass material, a resin material, or the like as a substrate. The light emitting layer has a polycrystalline phase, and preferably an amorphous phase, nanocrystals are dispersed in the light emitting layer so as to be in an optimum state, both the carriers have mobility in the light emitting layer, and the carrier densities of both the electrodes interposing the light emitting layer are controlled so that both the carriers can be injected into the light emitting layer. As a result, recombination between holes and electrons occurs in the nanocrystals forming luminescent centers, which enables the implementation of efficient light emission.

Whereas, in the quantum dot-dispersed light emitting device of the invention, the ambipolar inorganic semiconductor material is an amorphous semiconductor phase.

In the amorphous phase, no crystal grain boundary is present, and no crystal defect is present, and therefore, non-light emitting recombination of both the carries at the grain boundary or the defect does not occur. For this reason, both the carriers can be introduced into nanocrystals with efficiency. Further, the amorphous phase is uniform and isotropic in terms of the chemical composition and the structure. In addition, when it is in the form of a film, the surface smoothness tends to be obtained. Therefore, it is possible to form a quantum dot-dispersed light emitting device with stable characteristics.

Whereas, the quantum dot-dispersed light emitting device of the invention includes the one in which the ambipolar inorganic semiconductor material is a polycrystal semiconductor phase.

With this configuration, the mobility is high, and the radiationless transition due to the localized level at the band edge occurs less. As a result, it is possible to implement efficient light emission. Further, for the polycrystal semiconductor layer, the grain boundaries are aligned. As a result, it is possible to obtain better light emission.

Still further, the quantum dot-dispersed light emitting device of the invention includes one in which the ambipolar inorganic semiconductor material is a single crystal semiconductor phase.

For the single crystal, there is no grain boundary, and hence nothing inhibits the transfer of carriers. This enables efficient light emission.

Further, the quantum dot-dispersed light emitting device of the invention includes one in which the ambipolar inorganic semiconductor material is configured of a ZnS type semiconductor.

With this configuration, emission of visible light becomes possible, and a low temperature process becomes possible. Further, the ZnS type semiconductor is a low-cost, low environmental load material, and it is possible to fabricate a light emitting device driven at about 3V. Still further, the following effect is produced. Even when a single crystal is not formed, a prescribed value or more of carrier mobility can be obtained.

Further, the quantum dot-dispersed light emitting device of the invention includes one in which the ambipolar inorganic semiconductor material is configured of $Zn_pM_{1-p}S_xSe_yTe_{1-x-y}$ (where $0 \leq x, y, x+y \leq 1, 0 \leq p \leq 1$, M: alkaline-earth metal, Cd).

With this configuration, the following effects are produced. Even when a single crystal is not formed, a prescribed value or more of carrier mobility can be obtained; thus, emission of visible light becomes possible, and it is possible to fabricate a light emitting device driven at about 3 V.

Still further, the quantum dot-dispersed light emitting device of the invention includes one in which the nanocrystals contain any of InP, GaAs, and GaP as a main component.

With this configuration, it is possible to emit visible light with a given wavelength ranging from blue to red. This produces the effect of enabling the formation of a practical light emitting device.

Furthermore, the quantum dot-dispersed light-emitting device of the invention includes one in which the nanocrystals have an average value of grain sizes of 0.5 nm or more and 20 nm or less.

With this configuration, the nanocrystals can be favorably used as quantum dots. When the grain size is 0.5 nm or less, the nanocrystals become thermally unstable. Thus, function deteriorates with time due to the heat generation or the substance transfer entailed by electric current injection. When the grain size is 20 nm or more, the wave function of carriers diffused in the nanocrystals spatially expands excessively, and is not sufficiently quantized. Namely, the nanocrystals do not function as quantum dots.

Whereas, the quantum dot-dispersed light emitting device of the invention includes one in which the nanocrystals have a ratio of the statistical standard deviation to the average value of the diameters of 30% or less.

With this configuration, it is possible to improve the luminous efficiency. When the ratio exceeds 30%, the variance of diameters is too broad. Thus, not only is the monochromatism of the emission wavelength degraded, but also sharp density of states is implemented insufficiently. As a result, the luminous efficiency is not enhanced sufficiently. Further, the ratio of the statistical standard deviation to the average value of the diameters of the nanocrystals is preferably 30% or less, more preferably 10% or less, and further preferably 5% or less.

Further, the quantum dot-dispersed light emitting device of the invention is characterized by having a core shell structure in which the nanocrystals are coated with an inorganic semiconductor material having ambipolarity. Namely, it has a structure in which the nanocrystals serving as luminescent centers correspond to cores, and the shell coats the core. This configuration facilitates the injection of electrons and holes from the light emitting layer to the nanocrystals.

Herein, the shell (coating layer) mainly plays the role of "quantum confinement in cores (nanocrystals)". By selecting the same material as the ambipolar inorganic semiconductor material in the light emitting layer as the shell material, the matching property of the nanocrystal in the light emitting layer is enhanced. This enables the enhancement of the luminous efficiency. When, as the shell material, a different material from the ambipolar inorganic semiconductor material in the light emitting layer is selected, a material with a deeper valence band and a shallower conduction band than those of the core material (i.e., with a wider band gap than that of the core material) is selected as the shell material. As a result, it is possible to have quantum confinement effect. In this case, the film thickness of the shell is preferably set to be sufficiently thin.

Still further, the quantum dot-dispersed light emitting device of the invention includes one in which at least one of the electron injection electrode and the hole injection electrode is an amorphous phase.

With this configuration, it is possible to eliminate the factor causing the formation of lattice defects in the light emitting layer without causing a problem of lattice matching property with the light emitting layer. Further, the device is easy to manufacture and is isotropic, and it is possible to obtain a surface smoothness.

Furthermore, the quantum dot-dispersed light emitting device of the invention includes one in which at least one of the electron injection electrode and the hole injection electrode is a polycrystalline phase.

With this configuration, the device is easy to manufacture and can be formed without being restricted by the substrate material.

Further, the quantum dot-dispersed light emitting device of the invention includes one in which the electron injection electrode is configured of an n type semiconductor material having a carrier density of $1 \times 10^{18}/cm^3$ or more.

With this configuration, an electron-injectable low-resistance electrode can be formed even if the semiconductor material is not a single crystal.

Further, the quantum dot-dispersed light emitting-device of the invention includes one in which the electron injection electrode is configured of Cl-doped $Zn_pM_{1-p}S_xSe_yTe_{1-x-y}$ (where $0 \leq x, y, x+y \leq 1, 0 \leq p \leq 1$, M: alkaline-earth metal, Cd).

With this configuration, it is possible to more enhance the carrier injection efficiency. Also when a ZnS type amorphous semiconductor material or a ZnS type polycrystalline semiconductor material is formed as a light emitting layer, it is possible to enhance the luminous efficiency.

Still further, the quantum dot-dispersed light emitting device of the invention includes one in which the hole injection electrode is configured of a p type semiconductor material having a carrier density of $1 \times 10^{19}/cm^3$ or more.

With this configuration, a hole-injectable low-resistance electrode can be formed even if the semiconductor material is not a single crystal.

Furthermore, the quantum dot-dispersed light emitting device of the invention includes the one in which the hole injection electrode is configured of Cu-doped $Zn_pM_{1-p}S_xSe_yTe_{1-x-y}$ (where $0 \leq x, y, x+y \leq 1, 0 < p \leq 1$, M: alkaline-earth metal, Cd).

With this configuration, it is possible to enhance the carrier injection efficiency even more. Also when as the light emitting layer, a ZnS type amorphous semiconductor material or a ZnS type polycrystalline semiconductor material is formed, it is possible to enhance the luminous efficiency. Further, the material is a light transmittable material. Therefore, by using it for the light extraction side electrode, it is possible to obtain more efficient light emission characteristics.

Further, the quantum dot-dispersed light emitting device of the invention includes one in which the substrate is a glass substrate.

With this configuration, it is possible to obtain a quantum dot-dispersed light emitting device which can be manufactured with ease and at a low cost. Further, an increase in area thereof becomes possible, which enables the implementation of a large area light emitting device, display, illumination instruments, or the like.

Still further, the quantum dot-dispersed light emitting device of the invention includes the one in which the substrate is a resin substrate.

With this configuration, it is possible to obtain a display or an illumination instrument which is low in weight, is strong in impact resistance, has flexibility, and is suitable for being carried.

Furthermore, the quantum dot-dispersed light emitting device of the invention includes one characterized in that the electron injection electrode and the hole injection electrode are disposed spaced apart from each other, with the inorganic light emitting layer interposed therebetween, in a lamination on the substrate.

With this configuration, it is possible to obtain a quantum dot-dispersed light emitting device by which light extraction is easy, which is easy to manufacture, and which occupies a small area.

Further, the quantum dot-dispersed light emitting device of the invention includes one in which the electron injection electrode and the hole injection electrode are disposed spaced apart from each other in a plane on the substrate.

With this configuration, the number of manufacturing steps is small, and the reliability can be improved.

Whereas, the quantum dot-dispersed light emitting device of the invention includes one in which a gate electrode is formed between the electron injection electrode and the hole injection electrode.

With this configuration, it becomes possible to provide a semiconductor apparatus with higher controllability.

A method for manufacturing the quantum dot-dispersed light emitting device of the invention includes a step of preparing a substrate, a step of forming an electron injection electrode, a step of forming a hole injection electrode, and a step of depositing an inorganic light emitting layer in contact with the electron injection electrode and the hole injection electrode, characterized in that in the deposition step, an ambipolar inorganic semiconductor material is deposited on at least one of the electron injection electrode or the hole injection electrode made of an amorphous material or a polycrystal material.

With this configuration, it becomes possible to form easily the quantum dot-dispersed light emitting device with good workability.

Further, in the method for manufacturing the quantum dot-dispersed light emitting device of the invention, the deposition step includes a step of depositing an ambipolar inorganic semiconductor material on the substrate and then forming the electron injection electrode and the hole injection electrode spaced apart from each other in a plane.

As a result, it is possible to manufacture a quantum dot-dispersed light emitting device having a simple structure, and high in light extraction efficiency.

Further, in the method for manufacturing the quantum dot-dispersed light emitting device of the invention, the deposition step includes a step of forming the electron injection electrode and the hole injection electrode spaced apart from each other in a plane on the substrate, and then, depositing an ambipolar inorganic semiconductor material.

With this configuration, the ambipolar inorganic semiconductor material is formed after having undergone a photolithography step for the pattern formation of the electrodes. Therefore, the light emitting layer is damaged less. Thus, it is possible to obtain a high reliability light emitting layer.

Furthermore, in the method for manufacturing the quantum dot-dispersed light emitting device of the invention, the deposition step includes a step of depositing an ambipolar inorganic semiconductor material on the substrate, and then, forming the electron injection electrode and the hole injection electrode spaced apart from each other in a plane, and forming a gate electrode between both the electrodes.

With this configuration, it is possible to manufacture a flat transistor type quantum dot-dispersed light emitting device capable of light modulation by application with a gate voltage.

Further, in the method for manufacturing the quantum dot-dispersed light emitting device of the invention, the deposition step includes a step of depositing the ambipolar inorganic semiconductor material and, at the same time, dispersing quantum dots by an electrospray method.

With this configuration, it is possible to manufacture an inorganic light emitting layer containing quantum dots by a simple step. Herein, the ambipolar inorganic semiconductor material may be supplied by a general deposition apparatus for a molecular beam epitaxy (MBE) method, an ion beam deposition (IBD) method, or the like, or may be supplied by an electrospray method as with quantum dots. When the material is supplied by an electrospray method, fabrication can be carried out by using nanocrystal colloids of the ambipolar inorganic semiconductor material (described later).

Further, in the method for manufacturing the quantum dot-dispersed light emitting device of the invention, the deposition step includes a step of depositing the ambipolar inorganic semiconductor material, then, dispersing quantum dots by an electrospray method, and further depositing the ambipolar inorganic semiconductor material.

With this configuration, it is possible to adjust the distance between the quantum dot-dispersed area and the electrode layer, and it is possible to control the flow of both the carriers into the quantum dots.

In the method for manufacturing the quantum dot-dispersed light emitting device of the invention, the deposition step includes a step of forming a light emitting layer made of $Zn_pM_{1-p}S_xSe_yTe_{1-x-y}$ containing the nanocrystals at a substrate temperature of 100 to 400° C.

With this configuration, it is possible to obtain $Zn_pM_{1-p}S_xSe_yTe_{1-x-y}$ high in composition stability. At a temperature lower than 100° C., it is difficult to obtain light emission characteristics. At a temperature higher than 400° C., the Zn component vaporizes, and it becomes difficult to form a light emitting layer having the objective composition. The formation at 100° C. to 400° C. can provide a crystalline phase with a stable composition (including the solid solution) and can provide high carrier transfer characteristics.

Further, in the method for manufacturing the quantum dot-dispersed light emitting device of the invention, the deposition step includes a step of carrying out deposition at room temperature and carrying out post-annealing.

With this configuration, the interfaces of quantum dots and the interfaces of the ambipolar inorganic semiconductor material become close to each other, which eliminates the factor inhibiting the flow of both the carriers into the quantum dots. This can improve the light emission luminance, so that the luminous efficiency is improved. Further, the formation can be carried out while inhibiting the increase in the substrate temperature. Therefore, it is possible to prevent the substrate temperature from increasing for film formation. Then, after deposition, the film may be selectively annealed while inhibiting the increase in the substrate temperature. Incidentally, in the room temperature deposition step, deposition is carried out without heating the substrate. However, in actuality, a slight increase in substrate temperature occurs.

Whereas, when quantum dots are dispersed by an electrospray method using nanocrystal colloids (described later) as a raw material, post-annealing is carried out after dispersion, which can eliminate the material (such as trioctyl phosphine (TOP) or trioctyl phosphine oxide (TOPO)) coating the surfaces of nanocrystals (quantum dots). As a result, the transportability of carriers into quantum dots is enhanced, which can enhance the luminous efficiency.

Further, in the method for manufacturing the quantum dot-dispersed light emitting device of the invention, the step of carrying outpost-annealing includes a radio-frequency heating step.

With this configuration, a given layer (light emitting layer or electrode) can be selectively heated by radio-frequency heating. For example, deposition becomes possible without increasing the substrate temperature. Therefore, it is also possible to form a high reliability quantum dot-dispersed light emitting device on a resin substrate or a glass substrate without selecting the substrate material. Whereas, when a material with low heat resistance is used for the electrode or the light emitting layer, the order in which the electrode or the light emitting layer is formed/the position at which the electrode or the light emitting layer is formed is selected. As a result, it is possible to heat-treat only a desired layer.

Still further, in the method for manufacturing the quantum dot-dispersed light emitting device of the invention, the step of carrying out post-annealing includes a laser annealing step. For laser annealing, a pulse laser in an ultraviolet region is preferably used.

With this configuration, by controlling the pulse width, the laser wavelength, the laser power, and the like, it is possible to selectively heat a given layer (such as a light emitting layer/an electrode). For example, deposition becomes possible without increasing the substrate temperature. Therefore, it is also possible to form a high reliability quantum dot-dispersed light emitting device on a resin substrate or a glass substrate without selecting the substrate material. Whereas, when a material low in heat resistance is used for the electrode or the light emitting layer, the order in which the electrode or the light emitting layer is formed/the position at which the electrode or the light emitting layer is formed is selected. As a result, it is possible to heat-treat only a desired layer.

Further, in the method for manufacturing the quantum dot-dispersed light emitting device of the invention, the deposition step includes a step of forming a light emitting layer including a ZnS layer containing the nanocrystals at a substrate temperature of from 100 to 250° C.

With this configuration, it is possible to obtain high reliability ZnS. At a temperature outside the temperature range, light transmission characteristics are difficult to obtain under unchanged conditions. Incidentally, when deposition is carried out at 250° C. to 350° C., it is possible to obtain favorable characteristics without requiring a heat treatment subsequently. Incidentally, when deposition is carried out at a substrate temperature of 140° C. to 160° C., it becomes possible to apply a resin substrate or a glass substrate without restriction on the substrate material. Incidentally, in this case, by selectively heating the film by radio-frequency heating after deposition, it becomes possible to obtain a quantum dot-dispersed light emitting device with more favorable characteristics.

Further, the method for manufacturing the quantum dot-dispersed light emitting device of the invention includes a step of forming Cu-doped $Zn_pM_{1-p}S_xSe_yTe_{1-x-y}$ (where $0 \leq x$, y, $x+y \leq 1$, $0 < p \leq 1$, M: alkaline-earth metal, Cd) as the hole injection electrode, a step of depositing a $Zn_pM_{1-p}S_xSe_yTe_{1-x-y}$ (where $0 \leq x$, y, $x+y \leq 1$, $0 < p \leq 1$, M: alkaline-earth metal, Cd) ambipolar semiconductor layer containing nanocrystals made of InP on the hole injection electrode, and a step of stacking Cl-doped $Zn_pM_{1-p}S_xSe_yTe_{1-x-y}$ (where $0 \leq x$, y, $x+y \leq 1$, $0 < p \leq 1$, M: alkaline-earth metal, Cd) as the electron injection electrode.

With this configuration, it is possible to obtain a quantum dot-dispersed light emitting device having favorable light emission characteristics and increased efficiency.

Further, the apparatus of the invention, the display apparatus is characterized by being configured using the quantum dot-dispersed light emitting device.

An illumination apparatus of the invention is characterized by being configured using the quantum dot-dispersed light emitting device.

ADVANTAGE OF THE INVENTION

As described above, in the invention, an ambipolar inorganic semiconductor, and a hole injection electrode and an electron injection electrode capable of injecting both carriers therein are used, and the inorganic light emitting layer is formed in such a manner as to be capable of light emission without having been epitaxially grown with the electron injection electrode or the hole injection electrode. Therefore, it is possible to fabricate a large area light emitting diode without restricting the degree of freedom of design using an inorganic semiconductor not controllable to opposite polarities. Further, with this configuration, it is possible to obtain a light emitting diode of from the infrared/visible region to deep ultraviolet region using the amorphous light emitting layer on a glass substrate.

DESCRIPTION OF REFERENCE NUMERALS

Figure 1:
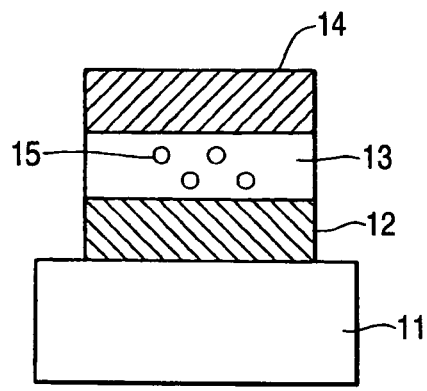
FIG. 1 A diagram showing a structure of a light emitting diode of the invention.

11 Substrate
12 Electron injection electrode
13 Light emitting layer
14 Hole injection electrode
15 Nanocrystals
21 Substrate
22 Electron injection electrode
23 Light emitting layer
24 Hole injection electrode
25 Nanocrystals
26 Gate electrode (for transistor)
31 n+ silicon layer
32 First epitaxial layer
33 Second epitaxial layer
34 p+ epitaxial layer
35 Quantum dots
41 Alkali-free glass substrate
42 ITO transparent electrode
43 Cu-doped ZnSe (hole injection electrode
44 ZnSe type amorphous semiconductor (light emitting layer)
45 Cl-doped ZnSe (electron injection electrode)
46 Core shell structure type InP—ZnSe nanocrystals

BEST MODE FOR CARRYING OUT THE INVENTION

Then, the embodiments of the present invention will be described in details by reference to the accompanying drawings.

First Embodiment (1) Structure

A light emitting diode as a quantum dot-dispersed light emitting device of the invention is, as shown in FIG. 1, characterized by being formed in such a manner that: on a substrate 11, an electron injection electrode 12, an inorganic light emitting layer 13 made of an ambipolar inorganic semiconductor material, and a hole injection electrode 14 are sequentially stacked, and the ambipolar inorganic semiconductor material includes therein nanocrystals 15 dispersed as luminescent centers, and the inorganic light emitting layer is in contact with the electron injection electrode 12 and the hole injection electrode 14 made of an amorphous phase or a polycrystalline phase, from which electrons and holes respectively flow into the nanocrystals in the inorganic light emitting layer 13 to implement efficient light emission.

Herein, the electron injection electrode and the hole injection electrode may be exchanged with each other. Namely, it is also acceptable that, on the hole injection electrode, the ambipolar semiconductor is formed, and further thereon, the electron injection electrode is formed.

Figure 3:
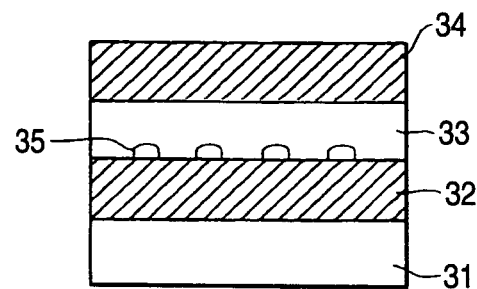
FIG. 3 A diagram showing a structure of a conventional light emitting diode.

The quantum dot-dispersed light emitting device is, as with the light emitting device of Patent Document 1 shown in FIG. 3, characterized by being formed so as to be capable of light emission with respective layers not formed while holding the epitaxial relation on an underlayer 31 as a substrate. Namely, respective layers are formed on the underlayer as a substrate with the continuity of the crystal lattices broken therebetween.

Figure 2:
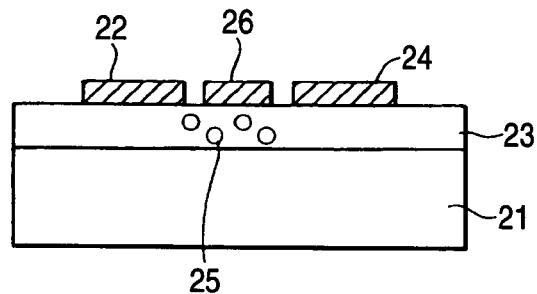
FIG. 2 A diagram showing a second structure of the light emitting diode of the invention.

Incidentally, the quantum dot-dispersed light emitting device is not required to assume the lamination structure as in FIG. 1. Namely, for example, it is also acceptable that, as shown in FIG. 2, on the substrate 21, the ambipolar inorganic semiconductor 23 is directly deposited, and on the surface, both the electrodes of the electron injection electrode 22 and the hole injection electrode 24 are formed at a given distance from one another (FIG. 2). Still further, it is also acceptable that a gate electrode 26 is disposed between the electron injection electrode 22 and the hole injection electrode 24 to form a transistor.

The material used for the electron injection electrode is a metal or a semiconductor capable of injecting electrons into the light emitting layer. The material used for the hole injection electrode is a metal or a semiconductor capable of injecting holes into the light emitting layer. In general, the materials used for both the electrodes and the material used for the light emitting layer may be different materials.

(2) Overall Operation

Below, the overall operation will be described by reference to FIG. 1.

When appositive electrical potential relative to the electrical potential of the electron injection electrode 12 is applied to the hole injection electrode 14, electrons from the electron injection electrode 12 and holes from the hole injection electrode 14 are injected respectively into the inorganic light emitting layer 13. The electrons and the holes in the inorganic light emitting layer 13 both flow into the nanocrystals 16, and are recombined with each other in the nanocrystals 16 to emit light with a wavelength corresponding to the energy difference between the recombination levels in the nanocrystals.

Thus, in the light emitting diode in accordance with the invention, the electrons and the holes, which are light emission sources, are all externally injected to the light emitting layer through the electron injection electrode and the hole injection electrode, respectively. Hence, the pn junction is not required.

The emission wavelength from the light emitting diode of the invention can be arbitrarily selected from across the ultraviolet to infrared region by controlling the material and the grain size of the nanocrystals (quantum dots) forming the luminescent centers. For this reason, light with a wavelength over a wide region of ultraviolet to infrared can be emitted with good monochromatism, and a device for emitting RGB three primary colors, or a white light emitting device can be fabricated. At this step, the voltage to be applied to the light emitting diode is determined by the forbidden band width of the ambipolar semiconductor used as the light emitting layer. The light emitting diode having a given spectral distribution as with RGB three primary colors or white color can be driven at the same voltage. Further, various characteristics such as heat characteristic, temperature characteristic, and aging characteristic do not largely vary according to the emission color.

(3) Details of Respective Portions
(Function/Material/Manufacturing Method, and the Like)

1. Substrate

The substrate serves as the foundation of respective layer to be formed thereon. For the substrate, a glass substrate, a single crystal substrate, a resin substrate, or the like can be used. The glass substrate has advantages. The glass substrate is capable of having a large area, capable of being transparent, capable of being surface-flattened to an atomic level, capable of withstanding a temperature as high as about 1000° C., and capable of being low priced. Namely, in the invention, a glass substrate can be used, and hence, it is possible to fabricate a light emitting diode device having dimensions of, for example, 1 square meter. For example, it is possible to implement a self-emitting type large display. Further, the glass substrate can be made transparent. Therefore, by forming the light emitting layer and the electrode layers using a similarly transparent wide gap semiconductor, it is possible to implement a see-through display. Further, since the glass substrate is used, a large flat illumination device can be implemented. For example, it can be mounted in the ceiling or the wall to create an unprecedented indoor environment. The glass substrate may be curved and provides high creativity. In addition, the glass substrate is not only more inexpensive than a single crystal substrate, but is also low in environmental load because $SiO_2$, which is the main component of the glass substrate, is nontoxic.

On the other hand, the single crystal substrate is suitable for the case where an epitaxial thin film is fabricated. By selecting the single crystal substrate material according to the thin film material, it is possible to form an epitaxial thin film. However, in the invention, the substrate can be formed without forming the epitaxial interface with at least one of the light emitting layer and the electrodes, which enables the formation with good productivity.

When ZnSe is used for the light emitting layer, a glass substrate, a ZnSe single crystal substrate, a GaAs single crystal substrate, a Si single crystal substrate, a sapphire substrate, or the like can be used.

When ZnS is used for the light emitting layer, a glass substrate, a ZnS single crystal substrate, a GaP single crystal substrate, a Si single crystal substrate, a sapphire substrate, or the like can be used.

When GaN is used for the light emitting layer, a glass substrate, a GaN single crystal substrate, a SiC single crystal substrate, a Si single crystal substrate, a sapphire substrate, or the like can be used.

When SiC is used for the light emitting layer, a glass substrate, a SiC single crystal substrate, a Si single crystal substrate, a sapphire substrate, or the like can be used.

When C (diamond) is used for the light emitting layer, a glass substrate, a diamond single crystal substrate, or the like can be used.

Further, the substrate is not required to be a glass substrate or the single crystal substrate described above. Namely, any substrate is usable as long as it is sufficiently resistant to a series of processes in manufacturing such as the formation and the patterning of the inorganic semiconductor layer and both the electrode layers. The material for the substrate may be, for example, a metal, or it may also be a ceramic or a plastic.

Particularly, the plastic substrate is low in weight, high in impact resistance, and flexible, and hence it is suitable for fabrication of a portable light emitting device, display, or illumination instrument and has a very high practical utility. The plastic substrate is lower in heat resistance than a glass-substrate or a single crystal substrate. Therefore, the process temperature is required to be sufficiently reduced. However, by selecting a proper ambipolar semiconductor material, and selecting a proper manufacturing step, it is possible to manufacture the light emitting device of the invention on a plastic substrate. For the heat treatment when a plastic substrate is used, the technique such as the radio-frequency heating or laser annealing is effective.

2. Light Emitting Layer

For the light emitting layer, an inorganic semiconductor having ambipolarity (ambipolar inorganic semiconductor) is used. Herein, the ambipolar inorganic semiconductor is not required to be a single crystal. However, it is more preferably amorphous. The amorphous phase does not have a grain boundary as distinct from polycrystal, and hence there is no possibility that electrons and holes are recombined with each other in non-light emitting manner at the grain boundary. Namely, in the invention, a crystalline phase material may be used for the light emitting layer, but an amorphous phase material or a polycrystalline phase material can be used. In the amorphous phase, no crystal grain boundary is present, and no crystal defect is present, and therefore, non-light emitting recombination of both the carries at the grain boundary or the crystal defect does not occur. For this reason, both the carriers can be introduced into nanocrystals with efficiency. Further, the amorphous phase is uniform and isotropic in terms of the chemical composition and the structure. In addition, when it is in the form of a film, the surface smoothness tends to be obtained. Therefore, it is possible to form a light emitting device with stable characteristics.

The ambipolar inorganic semiconductor may be a single crystal. This is because the single crystal also does not have a grain boundary as distinct from a polycrystal. Incidentally, when a polycrystal is used for the ambipolar inorganic semiconductor, a prismatic structure is formed so as to be in parallel to the leading direction of light, or the grain size is sufficiently increased. Thus, such a scheme is preferably devised so as to minimize the involvement of the grain boundaries in the transport characteristics and the recombination light emission characteristics of electrons and holes. Further, it is preferable that the ambipolar inorganic semiconductor does not have a defect, and does not contain impurity ions of a dopant and the like. This is because the defect and the impurity ions degrade the transport characteristics of carriers, and reduce the luminous efficiency.

Herein, the ambipolar inorganic semiconductor is an inorganic semiconductor having electron transportability and hole transportability at the same time. The ambipolarity can be measured by, for example, a time-of-flight method by pulsed light excitation. When the inorganic semiconductor does not have ambipolarity, namely, when there is no transportability of at least one of electrons and holes, the recombination phenomenon of electrons and holes cannot be induced in the inorganic semiconductor, so that the inorganic semiconductor cannot serve as an effective light emitting layer. The electrons and the holes injected into the ambipolar inorganic semiconductor flow into the nanocrystals introduced into the ambipolar inorganic semiconductor, and are recombined with each other in the nanocrystals, and emit light with a wavelength corresponding to the energy difference between emission levels.

In order to efficiently cause the recombination in the nanocrystals, it is preferable that the electron transportability and the hole transportability of the ambipolar inorganic semiconductor are at the same level. When the mobility of electrons and the mobility of holes are extremely different from each other, the recombination of both the carriers occurs at the interface between the electrodes and the light emitting layer, and does not occur in quantum dots. Therefore, it becomes difficult to obtain a sufficiently high luminous efficiency. Thus, in the invention, the effect of the ratio of the mobilities of both the carriers exerted on the light emitting site in the light emitting layer was examined, and the preferred range of the ratio of mobilities was elucidated. The preferred range of the ratio of mobilities is, specifically, 1/100 to 100. It is more preferably 1/10 to 10. Experimentally, the mobility can be measured with the time-of-flight method by pulsed light excitation. When the ratio of mobilities departs from the range of 1/100 to 100, both the carriers cannot flow efficiently into the nanocrystals.

In order to obtain the luminous intensity, it is preferable that both the mobilities of electrons and holes of the ambipolar inorganic semiconductor are large. When the mobility becomes small, the electron current or the hole current in the ambipolar inorganic semiconductor becomes too small. Thus, it is not possible to obtain a sufficiently high luminous intensity. The mobility is, specifically, preferably 0.1 $cm^2/Vs$ or more, more preferably 1 $cm^2/Vs$ or more, and further preferably 10 $cm^2/Vs$ or more. When both the mobility of electrons and the mobility of holes are smaller than 0.01 $cm^2/Vs$, it is not possible to obtain a practical luminous intensity The specific resistance value at room temperature of the ambipolar inorganic semiconductor is preferably large. In the ambipolar inorganic semiconductor, carriers are originally not present, and ideally, only the carriers injected from the electron injection electrode and the hole injection electrode move in the ambipolar semiconductor. Herein, the original carriers are holes and electrons generated by the defects and the impurity ions present in the ambipolar inorganic semiconductor. Therefore, a crystal with a large specific resistance value also denotes a good-quality crystal with less defects, and also denotes a substance not containing impurity ions. Specifically, the specific resistance at room temperature is preferably $10^8$ $\Omega cm$ or more. It is further preferably $10^{10}$ $\Omega cm$ or more. When the direct current specific resistance value is $10^8$ $\Omega cm$ or less, the density of the carriers generated by defects or impurity ions increases. Accordingly, the ratio of carriers injected from the electron injection electrode and the hole injection electrode relatively decreases. As a result, the controllability as a light emitting device is inhibited.

For the measurement of the specific resistance value, it is not proper to use a common direct specific resistance measuring method such as a four terminal method for the following reason. When the work function of the metal electrode to be used is small enough to allow electrons to be injected into the ambipolar inorganic semiconductor, or large enough to allow holes to be injected therein, the carrier density in the ambipolar inorganic semiconductor is controlled by the carriers flown from the electrode, and a markedly low resistance value than the resistance value by the carriers originally present in the ambipolar inorganic semiconductor is required. Conversely, when the work function of the metal electrode to be used is not so small as to allow electrons to be injected into the ambipolar inorganic semiconductor, and not so large as to allow holes to be injected therein, current cannot be fed into the ambipolar inorganic semiconductor. Therefore, in all the cases, the inherent direct current resistance value of the ambipolar inorganic semiconductor cannot be measured.

The mobility of the ambipolar inorganic semiconductor is determined with the time-of-flight method by pulsed light excitation. In addition, the carrier density in the ambipolar inorganic semiconductor is determined by the volume voltage measuring method. The specific resistance value can be calculated from both values. Alternatively, the measurement can be carried out by the method for determining the alternating current resistance using an electrode which does not inject carriers in the ambipolar inorganic semiconductor.

From the viewpoint of the carrier density in the ambipolar inorganic semiconductor, the carrier density is preferably $10^{16}/cm^3$ or less. It is further preferably $10^{14}/cm^3$ or less. When the carrier density is $10^{16}/cm^3$ or more, the ratio of carriers injected from the electron injection electrode and the hole injection electrode relatively decreases. As a result, the controllability as a light emitting device is inhibited. The carrier density in the ambipolar inorganic semiconductor can be measured by the volume voltage measuring method.

From the viewpoint of the dopant ion concentration in the ambipolar inorganic semiconductor, the dopant ion concentration is preferably 0.1% or less by atomic ratio. Further preferably, it is 1 ppm or less. When the dopant ion concentration is 0.1% or more, the ratio of carriers injected from the electron injection electrode and the hole injection electrode relatively decreases. As a result, the controllability as a light emitting device is inhibited. The dopant ion concentration can be measured by an X-ray photoelectron spectroscopy, an X-ray fluorescent measuring method, an inductively coupled plasma analysis method, a secondary ion mass spectrometry, or the like.

As the ambipolar inorganic semiconductor, a high-purity intrinsic semiconductor is most preferably used. As described later, a ZnS type, a carbon type, SiC, other group II-VI semiconductors, group III-V semiconductors, oxide semiconductors such as $CuInO_2$, nitride semiconductors such as $Si_3N_4$ and AlN, and the like can be used as the ambipolar inorganic semiconductors.

Herein, the group II-VI semiconductor is a semiconductor made of at least one element of Zn, Cd, and Hg, which are the group IIB elements on the periodic table, and at least one element of O, S, Se, Te, and Po, which are the group VIA elements, such as ZnO, ZnS, ZnSe, ZnTe, CdO, CdS, CdSe, or CdTe.

Whereas, herein, the group III-V semiconductor is a semiconductor made of at least one element of B, Al, Ga, In, and Tl, which are the group IIIA elements on the periodic table, and at least one element of N, P, As, Sb, and Bi, which are the group VA elements, such as AlN, AlP, AlAs, GaN, GaP, GaAs, InN, InP, or InAs Advantages of use of the amorphous phase of each of these materials as the ambipolar inorganic semiconductors are as follows: no grain boundary is present, the deposition temperature can be set low, the degree of freedom of the composition is high, the material has the isotropic property, and other advantages. Particularly, the deposition temperature is low, and hence, a plastic material can be used as a substrate. This and other advantages enlarge the selection range of the substrate. On the other hand, advantages of use of a crystal material as the ambipolar inorganic semiconductor are as follows: the mobility is high; and the radiationless transition due to the localized level at the band edge less occurs; and other advantages.

The electrons and the holes injected into the ambipolar inorganic semiconductor, which is the light emitting layer, flow into nanocrystals. However, in order for both the carriers to effectively flow into the nanocrystals, the materials for forming the nanocrystals must satisfy given physical conditions. This point will be stated in section "3. Nanocrystals".

Below, the ambipolar inorganic semiconductor for use as the light emitting layer will be individually described for each substance system.

(1) ZnS Type Semiconductor

The ZnS type light emitting layer is a substance containing at least one element selected from Zn and S, Se, and Te. Specifically, the layer may be made of ZnS, ZnSe, ZnTe, $ZnS_xSe_{(1-x)}$, (0<x, 1), or the like. These substances have a high melting point, are stable at room temperature, and are not degraded even when irradiated with sunlight. These impart high reliability to the light emitting diode of the invention.

The ZnS type light emitting layer may be a crystal, but it is preferably an amorphous phase. However, the crystal structure possessed by the material type is an important element because it determines the band structure of the light emitting layer and determines the emission wavelength and the luminous efficiency. The band structure of the amorphous phase can be understood based on the band structure of each crystal phase described later. For example, the forbidden band width of the amorphous phase is equal to the forbidden band width of each crystal phase. The crystals of ZnS, ZnSe, and ZnTe have the crystal structure of a ZnS type ($\beta$-ZnS structure or Zinc Blend structure), or wurtzite type ($\alpha$-ZnS structure), (A) ZnS Crystal Phase ZnS has, other than the ZnS type crystal structure, a wurtzite type crystal structure. The ZnS type has a low temperature phase transition and changes into the wurtzite type at 1,020° C. ZnS has a forbidden band width of 3.7 eV. The energy of 3.7 eV corresponds to 335 nm in terms of the wavelength of light. Therefore, ZnS can be used for emission of ultraviolet light, visible light, and infrared light, which have a wavelength of 335 nm or more. The light emission is caused by the nanocrystals dispersed in the ZnS light emitting layer. The forbidden band width of nanocrystals is selected to be smaller than the forbidden band width of ZnS. Therefore, the light emitting device of the invention emits ultraviolet light with a shorter wavelength than the wavelength of 335 nm, visible light, and infrared light.

(B) ZnSe Crystal Phase

ZnSe is a direct transition type wide gap semiconductor, which has a ZnS type crystal structure and has a forbidden band width of 2.8 eV. The semiconductor characteristics are superior in some aspects to ZnS and ZnTe. The forbidden band width is narrower than that of ZnS. The wavelength of light corresponding to the energy of 2.8 eV is 440 nm. The light emission is caused by the nanocrystals dispersed in the ZnSe light emitting layer. The forbidden bandwidth of nanocrystals is selected to be smaller than the forbidden band width of ZnSe. Therefore, the light emitting layer of the invention can be used for emission of visible light and infrared light, which have a wavelength of 440 nm or more.

(C) ZnTe Crystal Phase

ZnTe is a direct transition type wide gap semiconductor which has a ZnS type crystal structure or a wurtzite type crystal structure and has a forbidden band width of 2.8 eV. The semiconductor characteristics are superior in some aspects to ZnS and ZnTe. The forbidden band width is narrower than that of ZnS. The energy of 2.3 eV corresponds to 520 nm in terms of the wavelength of light. The light emission is caused by the nanocrystals dispersed in the ZnTe light emitting layer. The forbidden bandwidth of nanocrystals is selected to be smaller than the forbidden band width of ZnTe. Therefore, the light emitting device of the invention can be used for the light emission of visible light and infrared light, which have a longer wavelength than the wavelength of 520 nm.

(D) Crystal Phase of Solid Solution

ZnS, ZnSe, and ZnTe have the same crystal structure, and are mutually solid solved over the full range. Therefore, it can form a solid solution such as $ZnSe_xSe_{(1-x)}$ or $ZnS_yTe_{(1-y)}$, and can be used as the light emitting layer of the invention. As the substitution proceeds from S through Se to Te, the forbidden band width becomes narrower. The forbidden band width is 3.7 eV, which corresponds to the wavelength of 335 nm, for ZnS; 2.8 eV, which corresponds to the wavelength of 440 nm for ZnSe; and 2.4 eV, which corresponds to the wavelength of 520 nm for ZnTe.

It is also possible to substitute a part of Zn with Cd, Mg, Ca, Sr, Ba, or the like. For example, $Zn_xCd_{(1-x)}S$, $Zn_xMg_{(1-x)}Se$, $ZnxCa_{(1-x)}Se_yS_{(1-y)}$, or the like can be used as the light emitting layer. In this case, the proportion of Zn to be substituted is limited to about 10% of Zn. Substitution of a part of Zn can expand or narrow the band gap, which enables the adjustment of the emission wavelength.

(2) GaN Type Semiconductor

In this specification, the GaN type semiconductor is a substance containing at least one element selected from Ga, In, and Al, and N. Specifically, the semiconductor may be made of GaN, InN, AlN, $Ga_xIn_{(1-x)}N$, $Ga_xAl_{(1-x)}N$, or the like. As the substitution proceeds from In through Ga to Al, the position of conduction band edge can be controlled to expand the forbidden band width. This enables shorter wavelength light emission. The GaN type semiconductor is a direct semiconductor, and hence the emission recombination probability between electrons in the conduction band and holes in the valence band is high, which can implement high efficiency light emission. When the GaN type semiconductor is used for the light emitting layer of the invention, it is preferably an amorphous phase.

(3) SiC Type Semiconductor

In the invention, the SiC type semiconductor is a substance containing Si and C. The SiC crystals occur in a large number of polymorphisms, and each crystal structure has a different physical property value. The forbidden band width is 2.39 eV for 3C—SiC, 3.02 eV for 6H—SiC, and 3.27 eV for 4H—SiC. The Si—C type semiconductor is an indirect semiconductor, and hence the emission recombination probability between electrons in the conduction band and holes in the valence band is low. Thus, introduction of quantum dots is very effective for implementing high efficiency light emission. When the SiC type semiconductor is used for the light emitting layer of the invention, it is preferably an amorphous phase.

(4) Diamond Type Semiconductor

In the invention, the diamond type semiconductor is a substance containing carbon mainly forming the sp3 hybrid orbital as a main component. The sp3 hybrid orbital formed imparts the semiconductor-like properties. Whether the sp3 hybrid orbital is formed or what is the constitution ratio thereof can be examined by NMR, ultraviolet Raman spectroscopic analysis, electron beam energy loss spectrum analysis, or the like. The one in which 80 at % or more of carbon atoms form the sp3 hybrid orbital is preferable. The one in which 90 at % or more of carbon atoms of the total composition atoms form the sp3 hybrid orbital is further preferred.

The overall structure is preferably amorphous, but it may be crystalline. It may also be the one containing a crystalline phase in an amorphous phase. The crystalline substance in these cases is preferably the polycrystal structure of diamond. Namely, even when the overall structure is crystalline, or even when it is a crystalline phase in an amorphous phase, the crystalline phase included therein preferably has a diamond type crystal structure. Out of the semiconductors having a diamond type crystal, a single crystal diamond is preferred. As the materials of which the overall structure is crystalline, mention may be made of polycrystal diamond and single crystal diamond.

As the amorphous substances, mention may be made of amorphous-carbon (a-C), hydrogenated amorphous-carbon (a-C:H), amorphous carbon nitride (a-$C_xN_y$), hydrogenated amorphous carbon nitride (a-$C_xN_y$:H), nitrogenated amorphous-carbon (a-C:N), and halogenated amorphous-carbon (such as a-C:F or a-C:Cl).

(5) Si Type Semiconductor

The Si type semiconductor in the invention is a semiconductor containing Si as a main component. The semiconductors containing Si as a main component include amorphous Si and a Si crystal. In the invention, both can be used.

The Si crystal has a diamond structure, and has a forbidden bandwidth of 1.1 eV. The Si crystal is an indirect semiconductor. Therefore, the emission recombination probability between electrons in the conduction band and holes in the valence band is low, and introduction of quantum dots is very effective for implementing high efficiency light emission. When Si is used for the light emitting layer of the invention, it is preferably amorphous.

3. Nanocrystals

Nanocrystals are introduced in the light emitting layer of the invention. Herein, the nanocrystal denotes a very fine crystal of which the crystal grain size is indicated in the nano-meter unit. Particularly, in the invention, it denotes a crystal with a grain size in the range of 0.5 nm to 20 nm, and it is assumed to serve as a luminescent center. Particularly desirably, the grain size is desirably about 2 to 10 nm. Whereas, when it has a structure such that the core corresponding to the nanocrystal is coated with a shell, i.e., a "core shell structure", the thickness of the shell in the core shell structure is preferably 0.3 nm to 1 μm. More preferably, it is 0.6 nm to 100 nm. When it is 0.3 nm or less, the core cannot be coated. Accordingly, the effects do not emerge as quantum effects. When the thickness is 0.6 nm or more, the core can be coated. This enhances the quantum effects. When the thickness is close to 100 nm, not only the quantum effects can be sufficiently enhanced, but also the problems caused by the lattice strain of the shell, and the gap present in the space from the matrix are inhibited. Whereas, when the thickness is 1 μm or more, the filling density of the core in the light emitting layer becomes lower. Accordingly, sufficient luminance becomes less likely to be obtained.

Still further, as the material for nanocrystals, Si or a compound semiconductor can be used. The nanocrystal serves as a quantum dot. The nanocrystals, not only, are effective in enhancing the emission recombination probability, but also enable emission of light having a given wavelength to occur. Particularly when an amorphous or polycrystalline light emitting layer is formed on a glass substrate, the luminous efficiency is generally low. The improvement of the luminous efficiency by the nanocrystals is practically very effective The material to be used for nanocrystals do not effectively function as a luminescent center unless it is properly selected according to the material for the ambipolar inorganic semiconductor used as the light emitting layer. Namely, a. the position of the conduction band of the nanocrystal material must be deeper than the position of the conduction band of the ambipolar inorganic semiconductor material. In other words, the work function of the nanocrystal material must be larger than the work function of the ambipolar inorganic semiconductor material:

and, in addition to this, b. The position of the valence band of the nanocrystal material must be shallower than the position of the valence band of the ambipolar inorganic semiconductor material. In other words, the value of "work function+forbidden band width" of the nanocrystal material must be smaller than the "work function+forbidden band width" of the ambipolar inorganic semiconductor material.

By satisfying these conditions a and b at the same time, both of the hole and the electrons injected in the ambipolar inorganic semiconductor flow into the nanocrystals, and are recombined with each other in the nanocrystals to emit light.

The work functions and the forbidden band widths of various semiconductor materials have been reported by a large number of documents, and hence these can serve as references for material designing of the light emitting layer and the nanocrystals of the invention.

For example, regarding a II-VI compound semiconductor, there are the following documents. Each document includes diagrams regarding the band structure, which are useful for grasping the energy relationship of each semiconductor.

Non-Patent Document 1: Edited by Rameshwar Bhargava, "Properties of Wide Band Gap II-VI Semiconductors", Inspec publication, UK.

Non-Patent Document 2: Zhang et al., J. Appl. Phys. Vol. 83, No. 6, Page 3194. For example, when nanocrystals of CdSe are dispersed in an inorganic semiconductor layer including ZnS, they function as quantum dots.

Whereas, for example, it is also acceptable that $Zn_xCa_{(1-x)}Se_ySe_{(1-y)}$ is used as the ambipolar inorganic semiconductor material of the light emitting layer, and $Zn_xCd_{(1-x)}Te$ is used as the nanocrystal. Alternatively, for example, it is also acceptable that $Zn_xMg_{(1-x)}Se_yS_{(1-y)}$ is used as the ambipolar inorganic semiconductor material of the light emitting layer, and $Zn_xCd_{(1-x)}Se_ySe_{(1-y)}$ is used as the nanocrystal. The selection is required to be made so that the band gap of the luminescent center is narrower than the band gap of the ambipolar inorganic semiconductor material of the light emitting layer.

The diameter of the nanocrystal preferably falls within the range of 0.5 nm to 20 nm. When the grain size is 0.5 nm or less, the nanocrystals become thermally unstable. Thus, the function is deteriorated with time due to the heat generation or the substance transfer entailed by electric current injection. When the grain size is 20 nm or more, the wave function of carriers diffused in the nanocrystals spatially expands excessively, and is not sufficiently quantized. Namely, the nanocrystals do not function as quantum dots.

Whereas, the ratio of the statistical standard deviation to the average value of the diameters of the nanocrystals is preferably 30% or less, more preferably 10% or less, and further preferably 5% or less. When it exceeds 30%, the variance of diameters is too broad. Thus, the monochromatism of the emission wavelength is degraded, and a density of states is not sufficiently sharp. As a result, the luminous efficiency is not enhanced sufficiently.

The nanocrystals of the invention may be dispersed in the light emitting layer with any method so long as the foregoing conditions are satisfied. However, as described above, it is difficult to disperse nanocrystals with a high grain size uniformity in a high density. Under such circumstances, in the invention, for examples, it is also acceptable that nanocrystals are employed as one material of quantum dots, and dispersed in the light emitting layer. For example, as one material for nanocrystals with a high grain size uniformity, nanocrystals of a compound semiconductor synthesized by an organic chemical method can be used.

Herein, the compound semiconductor is a compound including two or more elements, and the generic name of a substance showing the properties of a semiconductor. It is often classified as a II-VI semiconductor, a III-V semiconductor, or the like according to the group of the periodic table of the constituent elements (*Butsurigaku Jiten*, BAIFUKAN Co., Ltd., 1986). Herein, the group II-VI semiconductor is a semiconductor including at least one element out of Zn, Cd, and Hg, which are the group IIB elements on the periodic table, and at least one element out of O, S, Se, Te, and Po, which are the group VIA elements on the periodic table. For example, it is ZnO, ZnS, ZnSe, ZnTe, CdO, CdS, CdSe, CdTe, or the like. Whereas, herein, the group III-V semiconductor is a semiconductor including at least one element out of B, Al, Ga, In, and Tl, which are the group IIIA elements on the periodic table, and at least one element out of N, P, As, Sb, and Bi, which are the group VA elements on the periodic table. For example, it is AlN, AlP, AlAs, GaN, GaP, GaAs, InN, InP, or InAs.

The organic chemical synthesis methods of compound semiconductor nanocrystals have been repeatedly reported in recent years. For example, Guzelian et al., allowed $InCl_3$ and $P(Si(CH_3)_3)_3$ to react with each other under heating, and synthesized InP nanocrystals with a diameter of 2 nm to 5 nm, surface-coated with tri-octyl-phosphine-oxide, and reported thereon (*Journal of Physical Chemistry*, vol. 100, page 7212, 1996). Whereas, Dabbousi et al., synthesized CdSe nanocrystals surface-coated with ZnS under control, and reported thereon (*Journal of Physical Chemistry B*, vol. 101, page 9466, 1997).

In the invention, the nanocrystals of a compound semiconductor synthesized by the organic chemical method are referred to as nanocrystal colloids. These nanocrystal colloids can be sufficiently reduced in grain size, and narrowed in grain size distribution by controlling the synthesis conditions with precision. Namely, it is possible to set the grain size within the range of 0.5 nm to 10 nm, and set the ratio of the statistical standard deviation to the average value of grain sizes preferably at 5% or less, and more preferably at 1% or less.

It is possible to disperse the foregoing nanocrystal colloids in the light emitting layer of the invention, and to allow them to effectively function as quantum dots.

For example, when ZnSe is selected for the light emitting layer, in growing ZnSe on an appropriate substrate, nanocrystal colloids of InAs, InP, CdTe, or the like are dispersed with an appropriate method. As a result, it is possible to fabricate a light emitting diode including nanocrystals dispersed therein. These nanocrystals function as quantum dots in the ZnSe light emitting layer.

Whereas, particularly, for example, in growing ZnSe on an appropriate substrate, InAs nanocrystal colloids surface-coated with ZnSe are dispersed, and thereby function as favorable quantum dots. In this case, the chemical composition of the light emitting layer and the chemical composition of the coating layer (corresponding to the shell) for coating the nanocrystal (corresponding to the core) are equal. Therefore, both the layers match each other with ease, and in the deposition process, the interface between the inorganic semiconductor layer and the coating layer can be eliminated. Namely, in the case of this example, the nanocrystals of InAs or the like can be dispersed with no inclusion of impurities or defects in the ZnSe semiconductor. For this reason, the impurity level or the defect level is not formed, and the electrons and the holes injected into the inorganic semiconductor flow into the nanocrystals formed by the InAs nanocrystals with efficiency, and they are recombined with each other with efficiency. As a result, it is possible to implement a light emitting diode with high luminous efficiency.

The nanocrystal colloids are dispersed in the light emitting layer. As the method therefor, a proper manufacturing method for forming a light emitting layer including nanocrystals dispersed therein may be desirably selected.

For example, Danek et al., reported an example in which nanocrystal colloids were dispersed in a ZnSe thin film, which is an inorganic semiconductor, and the fluorescence emission spectrum by photoexcitation was measured (M. Danek et al., *Applied Physics Letters*, vol. 65 (1994), page 2795). Herein, nanocrystal colloids of CdSe were dispersed in a mixed solution of pyridine and a cetonitrile, and introduced into an organometallic chemical vapor deposition (OMCVD) reactor by electrospray. Thus, it was deposited on a glass substrate together with ZnSe grown from selenium hydride and diethylzinc. The grown ZnSe film was an amorphous or polycrystalline form. As for the characteristics of light absorption and fluorescence at room temperature, the film held the characteristics of the introduced CdSe nanocrystals.

The electrospray method adopted by Danek et al., is effective as a method for dispersing nanocrystals in the light emitting layer of the invention.

As described above, the nanocrystal colloids function as quantum dots with efficiency by being dispersed in the light emitting layer with a proper manufacturing method. However, the approach in which nanocrystal colloids are produced by the organic chemical synthesis method is one effective means of nanocrystal synthesis. When other equally or more effective means are discovered, nanocrystals may be synthesized by using the means. Whereas, the method in which nanocrystals are synthesized, and then dispersed in the light emitting layer is one of effective means as the method for forming the nanocrystal-dispersed light emitting layer. When other equally or more effective means are discovered, the nanocrystal-dispersed light emitting layer may be formed by using the means.

4. Electron Injection Electrode and Hole Injection Electrode

The electron injection electrode and the hole injection electrode have a function of injecting electrons and holes, respectively, into the light emitting layer by application of a voltage across the electrodes. In the ambipolar inorganic semiconductor of the invention, originally, there are no carriers. Therefore, unless a barrier-free junction is implemented between the electrodes, electrons and holes cannot be injected into the ambipolar inorganic semiconductor. In the invention, a substance capable of forming a barrier-free junction between each electrode and the ambipolar inorganic semiconductor forming the light emitting layer is selected.

In the case of the electron injection electrode, when the work function of the electron injection electrode is smaller than the conduction band edge energy of the ambipolar inorganic semiconductor, the combination does not cause a barrier therebetween. Whereas, in the case of the hole injection electrode, when the work function of the hole injection electrode is larger than the conduction band edge energy of the ambipolar inorganic semiconductor, the combination does not cause a barrier therebetween. In forming a junction with the ambipolar inorganic semiconductor, a substance must be selected, and a process must be devised so as to prevent the formation of an unintended barrier due to induction of a chemical reaction or the like.

It is acceptable that the substance capable of barrier-free junction with the ambipolar inorganic semiconductor has a different chemical composition or crystal structure from that of the ambipolar inorganic semiconductor. For example, when ZnSe is selected for the ambipolar inorganic semiconductor, the conduction band edge energy of ZnSe is reported to be 3.8 eV (edited by Bhargava, *Properties of Wide Bandgap II-VI Semiconductors*, page 38, Inspec Co., 1997). On the other hand, the work function of Mg is described to be 3.46 eV (written by Yoshihiro Hamakawa, *Handoutai Debaisu Kougaku*, page 31, Ohmsha). Therefore, unless an unintended barrier is formed therebetween, a barrier-free junction becomes possible according to the combination of ZnSe and Mg.

The substances capable of barrier-free junction with the ambipolar inorganic semiconductor are not limited to metals. For example, Morita et al. finds a new compound of a Cu—Al—Se system, forms a junction with ZnSe, and studies the current voltage characteristics (*Japanese Journal of Physics*, vol. 30, page 3802, 1991). It is also acceptable that such a substance is found, and that a junction with the ambipolar inorganic semiconductor, through which electrons or holes are injected, is fabricated.

In actuality, the number of proper materials for the hole injection electrode or the electron injection electrode is not large.

For example, when Si is used for the ambipolar inorganic semiconductor of the light emitting layer, Pt, Al, Mg, or the like can be used as the hole injection electrode. Whereas, for example, when ZnSe is used for the ambipolar inorganic semiconductor of the light emitting layer, N-doped ZnSe can be used as the hole injection electrode material. However, the hole concentration of N-doped ZnSe is, at most, $1 \times 10^{18}/cm^3$. Therefore, it is preferable to use a material having a higher hole concentration and a higher electrical conductivity. Whereas, the electrical conductivity of N-doped ZnSe is effectively exhibited only when N-doped ZnSe has been fabricated in the form of a single crystal film. Therefore, it is preferable to use a material exhibiting a high electrical conductivity even in the form of a polycrystal film. From this viewpoint, Cu-doped ZnSe is preferable. Whereas, as the electron injection electrode material for injecting electrons into the ZnSe ambipolar inorganic semiconductor, for example, Cu-doped ZnSe can be used.

The hole injection electrode material and the electron injection electrode material preferably have a carrier density of $10^{18}/cm^3$ or more. It has a carrier density of more preferably $10^{19}/cm^3$ or more, and further preferably $10^{20}/cm^3$ or more. When the carrier density is less than $10^{18}/cm^3$, the metallic property of the electrode material is low. Accordingly, the applied voltage is applied to the electrode material, and it is not applied to the light emitting layer effectively. This phenomenon causes the reduction of the luminous efficiency.

When in wiring a lead wire to the hole injection electrode and the electron injection electrode, the hole injection electrode and the electron injection electrode are coated with a metal electrode, they tend to be suitable for a step of wire bonding or the like. For example, when as the hole injection electrode, Cu-doped ZnSe is used, or as the electron injection electrode, Cl-doped ZnSe is used, a metal such as Pd, Pt, Au, or Al is desirably mounted on the electrodes. Particularly, Au or Al is suitable for a wire bonding step. Whereas, particularly, by enhancing the lattice matching property with ZnSe or enhancing the matching property of the band structure by using a compound system of $Pd_5ZnSe$, or the like, or a material of an alloy system, it is possible to lengthen the life of the device or to reduce the contact resistance.

5. Gate Electrode

As shown in FIG. 2, in the invention, a gate electrode 26 may be formed at the midpoint between the electron injection electrode 22 and the hole injection electrode 26. Further, the material for the gate electrode is selected so that the junction between the gate electrode 26 and the light emitting layer 23 becomes a Schottky type. Alternatively, an insulation layer is interposed between the gate electrode 26 and the light emitting layer 23, resulting in a structure in which insulation is established between the gate electrode and the light emitting layer.

Then, by changing the electrical potential of the gate electrode, it is possible to control the flow of both the carriers, and to modulate the light emission characteristics. For example, when positive/negative voltages are applied to the electron injection electrode 22 and the hole injection electrode 24, respectively, with reference to the electrical potential of the gate electrode, electrons from the electron injection electrode and holes from the hole injection electrode are attracted according to the gate electrode electron injection electrode, and gate electrode hole injection electrode voltages, respectively, into the light emitting layer 23. They flow into nanocrystals 25 dispersed in the channel portion formed by the electron injection electrode 22 and the hole injection electrode 24, and are recombined with each other to emit light. For this reason, even when the electrical potentials of the electron injection electrode and the hole injection electrode are kept constant, it is possible to control the flow of both the carriers by changing only the electrical potential of the gate electrode, and it is possible to modulate the light emission characteristics.

Example 1

Then, an example of the invention will be described. The light emitting diode uses a glass substrate as a substrate, and may use a general glass plate. However, use of an alkali-free glass substrate for use in a liquid crystal display is preferable in that the semiconductor functions are less likely to be deteriorated.

Figure 4:
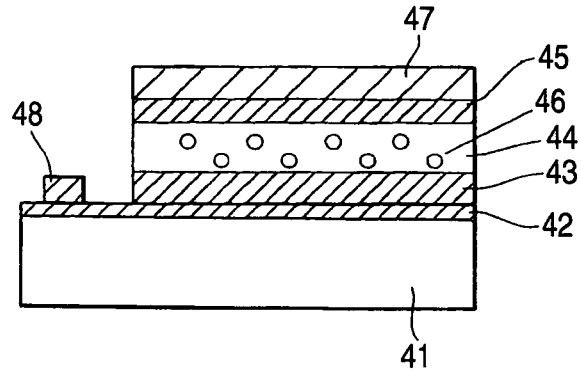
FIG. 4 A diagram showing a structure of a light emitting diode which is a typical example of the invention.

This light emitting diode is formed in the following manner as shown in FIG. 4. On a glass substrate 41, an ITO thin film 42 (film thickness 300 nm) is formed as a transparent electrode. As a hole injection electrode 43, for example, a Cu-doped ZnSe thin film with a carrier concentration of $1 \times 10^{19}/cm^3$ or more is deposited thereon with a film thickness of 300 nm. As a light emitting layer 44 (film thickness 30 nm), a ZnSe type amorphous ambipolar inorganic semiconductor is formed thereon. In the light emitting layer, InP nanocrystals 46 of a core shell structure with InP as the core, and with ZnSe as the shell are dispersed for the formation. Then, on the light emitting layer, a polycrystal thin film of an electron injection electrode 45 (film thickness 500 nm) made of a Cl-doped ZnSe thin film with a carrier concentration of $1 \times 10^{18}/cm^3$ or more having a metallic electrical conductivity is deposited. Whereas, the hole injection electrode material is a transparent substance, and hence can implement a light emitting diode with a favorable luminous efficiency. Incidentally, on the ITO and on the electron injection electrode 45, an electrode 48 and an electrode 47 of Al or the like are formed, respectively. Thus, feeding to the hole injection electrode is carried out by the electrode 48 formed on the ITO. On the other hand, feeding to the electron injection electrode 45 is carried out by the electrode 47.

Then, the method for manufacturing the semiconductor light emitting device will be described.

As the ambipolar inorganic semiconductor for forming the light emitting layer, ZnSe was selected. The alkali-free glass substrate 41 with the ITO thin film 42 was introduced as a deposition substrate into a vacuum apparatus for molecular beam epitaxy (MBE) deposition (manufactured by EIKO Engineering, attainable vacuum degree $5 \times 10^{-10}$ Torr) and held on a substrate holder (FIG. 5A).

Figure 5:
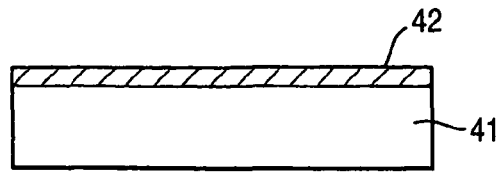
FIGS. 5A to 5E Diagrams showing manufacturing steps of the light emitting diode.
Figure 5:
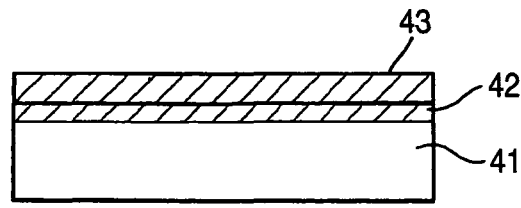
Figure 5:
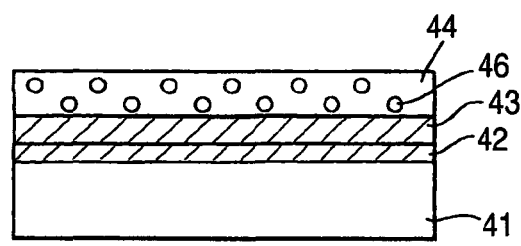
Figure 5:
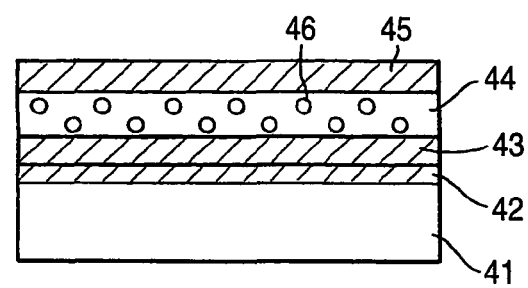
Figure 5:
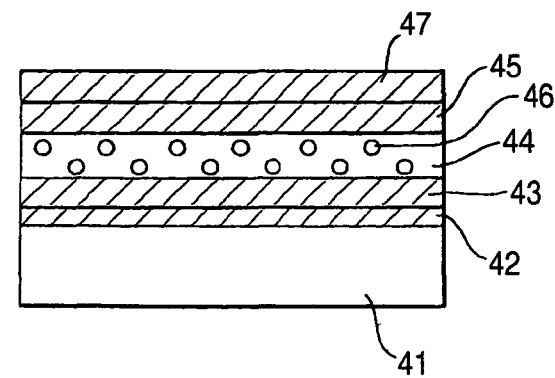

Then, as shown in FIG. 5B, the substrate was heated to 300° C., and allowed to stand for 15 minutes. Molecular beams of respective components were allowed to be emitted from a Zn cell, a Se cell, and a Cu cell, so that the hole injection electrode 43 made of a ZnSe polycrystal thin film that had been doped with Cu and had been made a p type metal, was deposited to 300 nm.

Subsequently, as shown in FIG. 5C, molecular beams of respective components were allowed to be emitted from the Zn cell, the Se cell, and a cell filled with a third component to form a ZnSe type amorphous phase. At this step, simultaneously, as a third component, ZnSe-coated InP nanocrystals (InP diameter 1.8 nm, the ratio of the grain size standard deviation to the grain size average value (CV value) 10%) dissolved in an organic solvent were emitted as a molecular beam by an electrospray method. Thus, all three molecular beams were applied to the substrate to deposit the light emitting layer 44 made of a ZnSe-coated InP nanocrystal-dispersed ZnSe thin film to 30 nm.

Then, as shown in FIG. 5D, molecular beams of respective components were allowed to be emitted from the Zn cell, the Se cell, and a $ZnCl_2$ cell, so that the electron injection electrode 45 made of a ZnSe thin film which had been made an n type metal was deposited to a thickness of 500 nm.

Finally, as shown in FIG. 5E, the electrode 47 of Al or the like is also formed on the electron injection electrode 45.

A voltage was applied across the electrode 48 and the electrode 47 of the light emitting diode thus formed. As a result, sharp light emission occurred at a wavelength of 460 nm, indicating that the light emitting diode of the invention effectively functioned.

Incidentally, in a ZnSe polycrystal sample, the grain boundary functions as a barrier for carrier conduction. For this reason, for example, when the carrier density is about $1 \times 10^{18} cm^3$, carriers cannot pass through the grain boundary. As a result, the ZnSe polycrystal becomes high in resistance. However, when the carrier density is improved to about $1 \times 10^{19} cm^3$, and further to $1 \times 10^{20} cm^3$ or more, the resistance value of the ZnSe polycrystal becomes significantly low. This can be explained based on the double schottky model. Namely, it is the model in which carriers are present in two grains, and the grain boundary functions as an energy barrier. Even when the carrier density is low, and carriers cannot pass through the energy barrier, an increase in carrier density causes the applied voltage to focus on the grain boundary. As a result, the width of the energy barrier is reduced, which enables carriers to tunnel. From this viewpoint, for the hole injection electrode, Cu-doped ZnSe is preferable. It can generate holes of $1 \times 10^{20} cm^3$ or more, and can implement a sufficiently low resistivity even in the form of a polycrystal film. For the electron injection electrode, Cl-doped ZnSe is suitable. This is because it can generate electrons of $1 \times 10^{19} cm^3$ or more. It is more preferable that an n type dopant with a still higher carrier density can be found.

In Example 1, Cu-doped ZnSe is used as the hole injection electrode. Therefore, even when it does not assume particularly a crystal structure of single crystal, a resistance as low as $10^{19}/cm^3$ or more can be obtained in an amorphous or polycrystalline phase. Thus, it is possible to form a quantum dot-dispersed light emitting device with favorable light emitting characteristics on a substrate which is not a single crystal.

Whereas, the hole injection electrode is not limited Cu-doped ZnSe, and any Cu-doped ZnS type semiconductor materials are acceptable. For example, the ZnS type semiconductor material is a semiconductor material represented by the compositional formula $(Zn_{1-\alpha-\beta}A_\alpha B_\beta)(S_{1-y-z}Se_y Te_z)$ (where $0 \leq y \leq 1$, $0 \leq z \leq 0.2$, $y+z \leq 1$, $0 \leq \alpha \leq 0.2$, $0 \leq \beta \leq 0.2$, A and B are each an alkaline-earth metal, Cd), and includes ones with a concentration of the Cu added as a dopant of 0.2 to 15 at %. Herein, the values of $\alpha$, $\beta$, y, and z are adjusted so that the valence band edge of the ZnS type semiconductor material is deeper in energy than the valence band edge of the ZnSe type amorphous material which is the light emitting layer, the valence band edge of the ZnSe type amorphous material which is the ambipolar inorganic semiconductor material of the light emitting layer. As a result, it is possible to inject holes from the hole injection electrode into the light emitting layer.

Herein, the ZnS type semiconductor material may be ZnS or ZnSe, or further a mixed crystal material thereof. The gist of the invention is as follows: by adding an unprecedentedly large amount of Cu to ZnS, ZnSe, or a mixed crystal material thereof, it becomes possible to implement a p type low resistance semiconductor inconceivable in the related art.

The present inventors found the following fact. When the concentration of Cu added is set at 0.2 to 15 at %, the ZnS type material is made into a low resistance p type semiconductor. The material subjected to such addition shows the characteristics of a p type low resistance semiconductor with a volume resistivity of $10^1$ Ωcm or less even in any phase of single crystalline, polycrystalline, and amorphous phases. Whereas, it does not present an intense absorption in the visible region, and hence, it hardly varies in light transmittance from the base material used, i.e., the ZnS type material. No ZnS type material that has light transmittancy in the visible region and thus has a small resistivity while being a polycrystal form has been discovered. The details of the reason why such characteristics can be obtained are unknown. However, this is considered to be due to the following fact. An increase in Cu concentration reduces the distance between Cu and Cu, so that an interaction between Cu and Cu occurs. As a result, another electron level is newly generated in the vicinity of the upper edge of the valence band of the ZnS type material. For this reason, such electrical characteristics not observable at all in a low concentration region occur only in a region with a high Cu concentration.

Incidentally, by using the hole injection electrode made of the Cu-doped ZnS type semiconductor, an ohmic connection can be established with ease with not only a metal having a large work function, such as Au, Pt, or Pd, but also a metal having a smaller work function than these such as Al or In. This is considered to be due to the very high carrier density. Further, an ohmic connection can be also formed with ITO (Indium tin oxide), ZnO, $Ga_2O_3$, $SnO_2$, or the like, which is a light transmittable electrical conductive form. The excellent characteristic of the semiconductor material is in that the hole injection electrode material can form an ohmic connection with commonly used various wiring materials as described above with ease.

Whereas, as described above, not only a single crystal phase, but also a polycrystalline phase or an amorphous phase have the characteristics of a low resistance p type electrical conductivity characteristics. Therefore, for manufacturing, a deposition technique under ultrahigh vacuum such as MBE is not necessarily required. Whereas, there are few restriction requirements on the substrate, so that the formation on a substrate of glass, plastic, or the like is possible.

Herein, the concentration of Cu added is 0.2 to 15 at %, and desirably 1 to 12 at %. When the concentration of Cu added is 1 at % or less, the resistivity tends to slightly increase. When the concentration of Cu added is 0.02 at % or less, the resistivity sharply increases, and becomes as large as $10^6$ Ωcm or more, resulting in poor practical utility.

When the Cu concentration exceeds 12 at %, the light transmittance in the blue wavelength region tends to slightly decrease. When the concentration of Cu added exceeds 15 at %, the Cu concentration is considered to exceed the solid solubility limit in ZnS or ZnSe. As a result, another phase of CuS, $Cu_2S$, CuSe, or the like is formed in manufacturing, so that a uniform material cannot be obtained. Whereas, in this case, CuS, $Cu_2S$, or CuSe has an intense light absorption in the visible region, and hence unfavorably, it becomes impossible to obtain the light transmittance in the visible light region.

Further, substantially, the light transmittance in the visible region hardly varies from that of the base material used, i.e., ZnS, ZnSe, or a mixed crystal of these materials. For this reason, in the case where the material is applied to a semiconductor light emitting device in the visible region, the light transmittance can be obtained when the material is used for the hole injection electrode. Therefore, the material is a very excellent material in that high light extraction efficiency can be desired.

Incidentally, to the Cu-doped ZnS type semiconductor material of the invention, as conventionally performed on the ZnS type semiconductor, another element is introducible, i.e., Mg or Cd is introducible in the form of Zn substitution, or Te is introducible in the form of S and/or Se substitution in an amount of about 20% as the upper limit. The introduction of these elements will not impair the essential features of the invention. The introduction of these elements enables the adjustment of resistivity, band alignment, transmission wavelength region, or refractive index, or the like. Introduction of Mg and Cd can elevate and lower the conduction band lower edge energy position, respectively. Introduction of Te can elevate the valence band upper edge energy position.

Whereas, as A and B in the formula, other than Mg or Cd, other alkaline-earth metal elements are also applicable.

Further, the Cu-doped ZnS type semiconductors of the invention include ones of which the semiconductor material contains at least one dopant selected from Cl, Al, Ga, and In as a compensator, and the compensator concentration is $10^{17}$ to $10^{20}$ $cm^{-3}$ ($5 \times 10^{-4}$ to 0.05 at %).

Further, Cu largely changes the carrier density. Therefore, it is possible to add a compensator and to make fine adjustments. Herein, as the compensator, it is configured such that the concentration of at least one dopant selected from Cl, Al, Ga, and In is $10^{17}$ to $10^{20}$ $cm^{-3}$ ($5 \times 10^{-4}$ to 0.05 at %).

Namely, for the Cu-doped ZnS type semiconductor material of the invention, it is possible to adjust the resistivity not based on the amount of Cu added but by using a compensator. As the compensator, Cl, Al, Ga, or In conventionally used as an n type dopant of a ZnS type semiconductor can be used. Such resistivity adjustment is a technology available for carrier balance adjustment, adjustment of the position of recombination between holes and electrons, and the like in forming the homojunction with an n type or intrinsic ZnS type semiconductor, or the heterojunction with other semiconductor materials, and constituting a semiconductor device.

Examples 2 and 3

ZnSe type light emitting diodes were fabricated in the same manner as in Example 1. However, as the nanocrystal material, ZnSe-coated InP was used. As the grain sizes of InP, two sets of 2.8 nm (CV value 10%) and 4.0 nm (CV value 30%) were adopted in place of 1.8 nm (CV value 10%) in Example 1. The respective luminescent center wavelengths and spectrum half-widths when a voltage of 5 V was applied were 460 nm (half-width 30 nm), 550 nm (half-width 30 nm), and 650 nm (half-width 70 nm).

Modified Examples 1 and 2

ZnSe-coated InP nanocrystal-dispersed ZnSe type light emitting diodes were fabricated in the same manner as in Examples 1 to 3. However, as the respective grain sizes of InP and CV values, two sets of 7.1 nm (CV value 10%) and 2.6 nm (CV value 40%) were adopted. The respective luminescent center wavelengths and spectrum half-widths when a voltage of 5 V was applied were 850 nm (half-width 40 nm) and 540 nm (half-width 30 nm).

Examples 4 and 5

PbSe nanocrystal-dispersed ZnSe type light emitting diodes were fabricated in the same manner as in Examples 4 and 5. However, the grain sizes of PbSe were set at 4.8 nm (CV value 10%) and 7.2 nm (CV value 10%).

Figure 6:
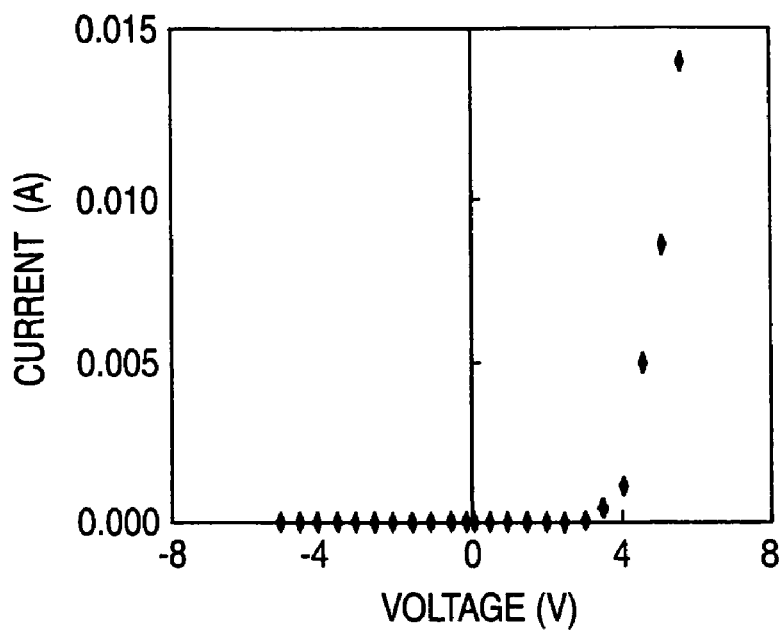
FIG. 6 A diagram showing the voltage current curve of the light emitting diode in accordance with the invention.
Figure 7:
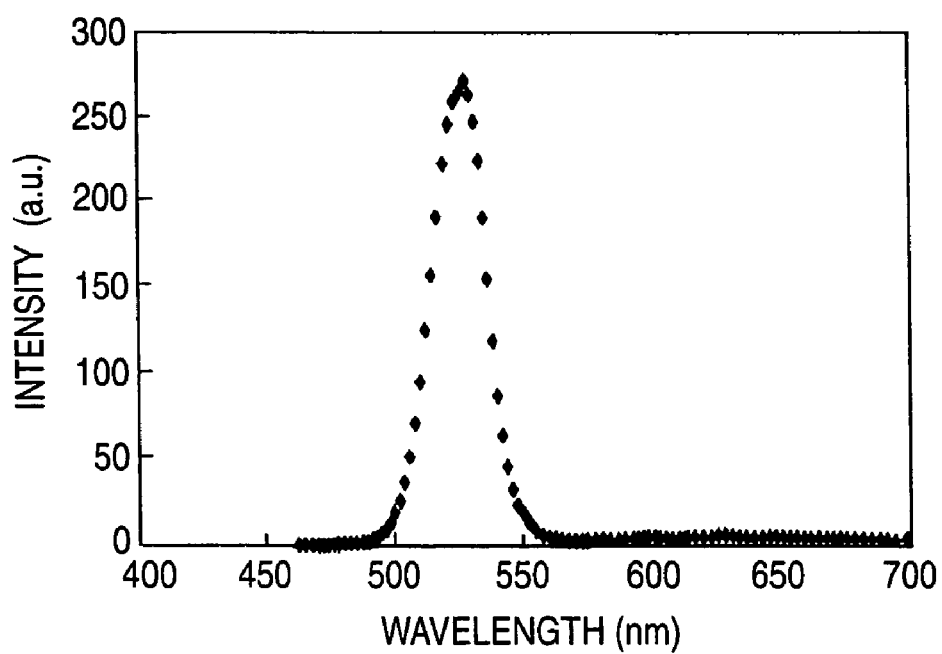
FIG. 7 A diagram showing the emission spectrum of the light emitting diode in accordance with the invention, described in Example 4.

FIG. 6 shows the voltage/current curve when a voltage is applied across the hole injection electrode and the electron injection electrode of the light emitting diode of which the grain size of PbSe is 4.8 nm formed in this manner. A favorable nonlinear curve has been obtained. The rising voltage is in the vicinity of 3 V, which corresponds to the forbidden band width of ZnSe which is an ambipolar inorganic semiconductor material. Whereas, FIG. 7 shows the emission spectrum obtained when a voltage of 5 V was applied to a light emitting diode of which the grain size of PbSe is 4.8 nm. Sharp light emission (green) occurred at a wavelength of 525 nm, indicating that the light emitting diode of the invention effectively functioned. Similarly, when a voltage of 5 V was applied to a light emitting diode of which the grain size of PbSe is 7.2 nm, light emission was obtained at a wavelength of 620 nm.

Modified Example 3

A ZnSe-coated PbSe nanocrystal-dispersed ZnSe type light emitting diode was fabricated in the same manner as in Example 4. However, the grain size of PbSe was set at 5 nm (CV value 40%). When a voltage of 5 V was applied, light emission was obtained at a wavelength of 530 nm. The half-width of emission spectrum was 100 nm.

Examples 6 to 17

ZnSe type light emitting diodes were fabricated in the same manner as in Example 1. However, the nanocrystal materials are ZnSe-coated InAs, InSb, GaAs, GaP, GaSb, CdO, CdS, CdSe, CdTe, ZnTe, PbS, and PbTe. For all the nanocrystals, the grain size was set at 5 nm, and the CV value was set at 20%.

The central emission wavelengths and the spectrum half-widths are shown in Table 1.

Example 18

In Example 2, as the ambipolar inorganic semiconductor material of the light emitting layer, ZnS was used, and PbSe nanocrystals (diameter 4.8 nm, the ratio of the grains size standard deviation to the grain size average value (CV value 10%)) were dispersed. For the electron injection electrode, Ga-doped-ZnS was used.

For the hole injection electrode, Cu-doped ZnS was used. With this configuration, the light emitting diode of the invention was fabricated. When a voltage of 5 V was applied across the hole injection electrode and the electron injection electrode, light emission having a wavelength of 385 nm was obtained.

Herein, the deposition temperature of the ZnS light emitting layer was studied, which led to the result that the deposition temperature is properly 100° C. to 250° C. At 100° C. or less, the ZnS phase was not crystallized. When the temperature was increased to 250° C. or more, on the contrary, the crystallinity was deteriorated. Particularly, at 400° C. or more, the Zn component improperly vaporized. A ZnS phase with the best crystallinity was obtained within the range of 120 to 180° C. Thus, the substrate temperature of 150° C. was selected to fabricate a light emitting diode.

Example 19

In Example 2, as the ambipolar inorganic semiconductor material of the light emitting layer, ZnTe was used, and PbSe nanocrystals (diameter 4.8 nm, the ratio of the grains size standard deviation to the grain size average value (CV value 10%)) were dispersed. Thus, the light emitting diode of the invention was fabricated. When a voltage of 5 V was applied across the hole injection electrode and the electron injection electrode, light emission having a wavelength of 620 nm was obtained.

Example 20

A lamination type light emitting diode using a GaP nanocrystal-dispersed GaN thin film as the light emitting layer was formed on a quartz glass substrate using a CVD process. Herein, as the hole injection electrode material, p-GaN:Mg (Mg-doped p type GaN) was used. Whereas, as the electron injection electrode material, n-GaN: Si (Si-doped n type GaN) was used. Thus, the light emitting diode of the invention was fabricated. When a voltage of 5 V was applied across the hole injection electrode and the electron injection electrode of the light emitting diode, green light emission having a wavelength in the vicinity of 550 nm was obtained.

Example 21

In Example 20, the ambipolar inorganic semiconductor material of the light emitting layer was changed to AlN, and GaP nanocrystals were dispersed. Thus, a light emitting diode of the invention was fabricated. When a voltage of 10 V was applied across the hole injection electrode and the electron injection electrode of the light emitting diode, green light emission having a wavelength in the vicinity of 550 nm was obtained.

Example 22

In Example 21, the ambipolar inorganic semiconductor material of the light emitting layer was changed to InN, and GaP nanocrystals were dispersed. Thus, a light emitting diode of the invention was fabricated. When a voltage of 5 V was applied across the hole injection electrode and the electron injection electrode of the light emitting diode, green light emission having a wavelength in the vicinity of 650 nm was obtained.

Example 23

A lamination type light emitting diode using a Si nanocrystal-dispersed SiC thin film as the light emitting layer was formed on a quartz glass substrate using a CVD process. Herein, as the hole injection electrode material, SiC:Al (Al-doped SiC) was used. Whereas, as the electron injection electrode material, SiC:N (N-doped SiC) was used. Thus, a light emitting diode of the invention was fabricated. When a voltage of 5 V was applied across the hole injection electrode and the electron injection electrode of the light emitting diode, green light emission having a wavelength in the vicinity of 500 nm was obtained.

Example 24

A lamination type light emitting diode using a GaN nanocrystal-dispersed C thin film as the light emitting layer was formed on a quartz glass substrate using a CVD process. Herein, as the hole injection electrode material, C:B (B-doped C) was used. Whereas, as the electron injection electrode material, C:N (N-doped C) was used. Thus, the light emitting diode of the invention was fabricated. When a voltage of 5 V was applied across the hole injection electrode and the electron injection electrode of the light emitting diode, green light emission having a wavelength in the vicinity of 400 nm was obtained.

Modified Example 4

In Example 1, as the hole injection electrode, p type ZnSe with a hole density of $3 \times 10^{17}$ was used. When a voltage of 10 V was applied across the hole injection electrode and the electron injection electrode, the electrical resistance was high, and it was not possible to obtain light emission.

In Example 1, an n type ZnSe single crystal substrate was used in place of the alkali-free glass, and a light emitting diode was fabricated. When a voltage of 5 V was applied across the hole injection electrode and the electron injection electrode of the light emitting diode, green light emission having a wavelength in the vicinity of 550 nm was obtained.

Example 26

In Example 1, Teflon (registered trade mark) which is a heat-resistant plastic material was used in place of the alkali-free glass as a substrate, and a light emitting diode was fabricated. When a voltage of 5 V was applied across the hole injection electrode and the electron injection electrode of the light emitting diode, green light emission having a wavelength in the vicinity of 550 nm was obtained.

Example 27

In Example 1, on an alkali-free glass substrate, a PbSe nanocrystal-dispersed ZnSe thin film was directly deposited to 30 nm. A Cl-doped ZnSe film 1 mm high, 0.5 mm wide, and 300 nm thick was formed thereon as the electron injection electrode. Then, a Cu-doped ZnSe film in the same shape was formed as the hole injection electrode. In this step, the electron injection electrode and the hole injection electrode were positioned in parallel so that the longitudinal sides oppose each other, and the distance between the electrodes was set at 1 mm. When a higher electrical potential by 5 V than that of the electron injection electrode was applied to the hole injection electrode, green light emission was obtained.

Example 28

In Example 27, a $SiO_2$ film 1 mm high, 0.5 mm wide, and 30 nm thick was formed at the central part of the area between the electron injection electrode and the hole injection electrode. A 300-nm thick Au thin film was stacked thereon to form a gate electrode. A higher electrical potential by 5 V than that of the electron injection electrode was applied to the hole injection electrode. Further, a higher electrical potential by 2 to 3 V than that of the electron injection electrode was applied to the gate electrode. As a result, green light emission was obtained, and the luminous intensity varied according to the electrical potential applied to the gate electrode.

Example 29

The Al electrodes 47 and 48 of the light emitting device (square 3 mm per side) fabricated in Example 1 were wire bonded with aluminum wires. A transparent epoxy resin was poured into a concave mirror made of glass with a diameter of 6 mm. The light emitting device was dipped the rein, and allowed to stand, so that the resin was hardened. Thus, when a voltage of 5V was applied across both the aluminum wires, green light emission was applied to the front of the concave mirror. This instrument is useful as a monochromatic lighting instrument.

Example 30

In Example 1, in dispersing ZnSe-coated InP nanocrystals, the nanocrystals used in Examples 2 and 3 were mixed, and applied in the form of a molecular beam. The light emitting device was fixed in the concave mirror as with Example 29. Thus, when a voltage of 5V was applied across both the aluminum wires, white light emission was applied to the front of the concave mirror. This instrument is useful as a white lighting instrument.

Example 31

In Example 1, a glass substrate 10 mm square and 0.5 mm thick (7059 manufactured by Corning) was used as the substrate, and the light emitting device of FIG. 4 was fabricated. However, the Al electrode 47 was not formed in a solid film, but in squares 500 μm per side in a pattern of 5 rows by 5 columns on the electron injection electrode 45. The distance between the electrodes was set as 500 μm. A probe card having the same array as with the pattern of 25 electrodes was fabricated, and it was brought in contact with the electron injection electrode. On the other hand, the Al electrode 48 was wire bonded with an aluminum wire. By applying a voltage of 5 V across a given probe and the aluminum wire, green light emission was obtained.

Further, by applying a voltage of 5 V across a given set of probes and the aluminum wire, it was possible to display characters and the like by light emission. The instrument is useful as a green dot matrix display. Further, when nanocrystals producing a different emission color for each pattern of the Al electrode 47 are dispersed, RGB light emission becomes possible on one substrate. As a result, it is possible to implement a full color display.

TABLE 1

| Example | Light emitting layer | Material | Nanocrystal Grain size (nm) | Grain size distribution (%) | N electrode material | P electrode material | Current injection light emission Central wavelength (nm) | Half-width (nm) |
|---|---|---|---|---|---|---|---|---|
| Ex. 1 | ZnSe | InP | 1.8 | 10 | Cl—ZnSe | Cu—ZnSe | 460 | 30 |
| Ex. 2 | ZnSe | InP | 2.8 | 10 | Cl—ZnSe | Cu—ZnSe | 550 | 30 |
| Ex. 3 | ZnSe | InP | 4.0 | 30 | Cl—ZnSe | Cu—ZnSe | 650 | 70 |
| M. Ex. 1 | ZnSe | InP | 7.1 | 10 | Cl—ZnSe | Cu—ZnSe | 850 | 40 |

TABLE 1-continued

| | | Nanocrystal | | | | | Current injection light emission | |
|---|---|---|---|---|---|---|---|---|
| Example | Light emitting layer | Material | Grain size (nm) | Grain size distribution (%) | N electrode material | P electrode material | Central wavelength (nm) | Half-width (nm) |
| M. Ex. 2 | ZnSe | InP | 2.6 | 40 | Cl—ZnSe | Cu—ZnSe | 540 | 150 |
| Ex. 4 | ZnSe | PbSe | 4.8 | 10 | Cl—ZnSe | Cu—ZnSe | 525 | 30 |
| Ex. 5 | ZnSe | PbSe | 7.2 | 10 | Cl—ZnSe | Cu—ZnSe | 620 | 30 |
| M. Ex. 3 | ZnSe | PbSe | 5.0 | 40 | Cl—ZnSe | Cu—ZnSe | 530 | 150 |
| Ex. 6 | ZnSe | InAs | 4 | 20 | Cl—ZnSe | Cu—ZnSe | 600 | 80 |
| Ex. 7 | ZnSe | InSb | 4 | 20 | Cl—ZnSe | Cu—ZnSe | 500 | 80 |
| Ex. 8 | ZnSe | GaP | 8 | 20 | Cl—ZnSe | Cu—ZnSe | 470 | 30 |
| Ex. 9 | ZnSe | GaAs | 6 | 20 | Cl—ZnSe | Cu—ZnSe | 660 | 30 |
| Ex. 10 | ZnSe | GaSb | 2 | 20 | Cl—ZnSe | Cu—ZnSe | 800 | 30 |
| Ex. 11 | ZnSe | CdO | 2 | 20 | Cl—ZnSe | Cu—ZnSe | 600 | 30 |
| Ex. 12 | ZnSe | CdS | 8 | 20 | Cl—ZnSe | Cu—ZnSe | 470 | 30 |
| Ex. 13 | ZnSe | CdSe | 6 | 20 | Cl—ZnSe | Cu—ZnSe | 540 | 30 |
| Ex. 14 | ZnSe | CdTe | 6 | 20 | Cl—ZnSe | Cu—ZnSe | 590 | 30 |
| Ex. 15 | ZnSe | ZnTe | 10 | 20 | Cl—ZnSe | Cu—ZnSe | 500 | 30 |
| Ex. 16 | ZnSe | PbS | 2 | 20 | Cl—ZnSe | Cu—ZnSe | 500 | 80 |
| Ex. 17 | ZnSe | PbTe | 2 | 20 | Cl—ZnSe | Cu—ZnSe | 600 | 80 |
| Ex. 18 | ZnS | PbSe | 5 | 20 | Ga—ZnS | Cu—ZnS | 385 | 40 |
| Ex. 19 | ZnTe | PbSe | 5 | 20 | Cl—ZnSe | Pd | 620 | 40 |
| Ex. 20 | GaN | GaP | 5 | 20 | Mg—GaN | Si—GaN | 550 | 50 |
| Ex. 21 | AlN | GaP | 5 | 20 | Mg—GaN | Si—GaN | 500 | 80 |
| Ex. 22 | InN | GaP | 5 | 20 | Mg—GaN | Si—GaN | 600 | 50 |
| Ex. 23 | SiC | Si | 5 | 20 | N—SiC | Al—SiC | 500 | 80 |
| Ex. 24 | C | GaN | 5 | 20 | N—C | B—C | 400 | 50 |

Note:
M. Ex.: Modified Example

Example 32

On a glass substrate, a ZnO thin film (film thickness 300 nm) was formed as a transparent electrode, and a polycrystal thin film of the electron injection electrode (film thickness 500 nm) made of a Cl-doped $ZnS_{0.35}Se_{0.65}$ thin film with a carrier concentration of $1\times10^{18}/cm^3$ or more, having a metallic electrical conductivity was deposited thereon. Herein, the ZnO thin film has a wurtzite type crystal structure, the Cl-doped ZnSe thin film has a zincblende type crystal structure, and the c axis of the ZnO thin film and the [111] axis of the Cl-doped ZnSe thin film were parallel to each other.

On the electron injection electrode, as the light emitting layer (film thickness 30 nm), first, a ZnSe type ambipolar inorganic semiconductor was formed to 15 nm. Then, nanocrystals of a core shell structure with CdSe as the core and with ZnSe as the shell (CdSe diameter 6 nm, the ratio of the grain size standard deviation to the grain size average value (CV value) 20%) were formed by an electrospray method using nanocrystal colloids. After the formation of nanocrystals, the surface was heated with pulse laser annealing, so that the material (trioctyl phosphine (TOP)) coating the surfaces of the nanocrystals was sublimated and eliminated. Further, the ZnSe type amorphous ambipolar inorganic semiconductor was formed to 15 nm to configure the light emitting layer.

Further, on the light emitting layer, a Cu-doped $Zn_{0.6}Mg_{0.4}S$ thin film with a carrier concentration of $1\times10^{19}/cm^3$ or more was deposited to 300 nm as the hole injection electrode. Incidentally, On ZnO and on the hole injection electrode, Al electrodes were formed, respectively.

A voltage was applied across the electrodes of the light emitting diode thus formed. As a result, sharp light emission (spectrum half-width 30 nm) occurred at a wavelength of 540 nm, indicating that the light emitting diode of the invention effectively functioned.

Example 33

On a glass substrate, a $(Zn_{0.7}Mg_{0.3})O$ thin film (300 nm) was deposited as the electron injection electrode. Subsequently, on the electron injection electrode, as the light emitting layer (film thickness 30 nm), first, a ZnSe type ambipolar inorganic semiconductor was formed to 15 nm. Then, nanocrystals of a core shell structure with CdSe as the core and with ZnSe as the shell (CdSe diameter 6 nm, the ratio of the grain size standard deviation to the grain size average value (CV value) 20%) were formed by an electrospray method using nanocrystal colloids. After the formation of nanocrystals, the surface was heated with pulse laser annealing, so that the material (trioctyl phosphine (TOP)) coating the surfaces of the nanocrystals was sublimated and eliminated. Further, the ZnSe type amorphous ambipolar inorganic semiconductor was formed to 15 nm to configure the light emitting layer.

Herein, the $(Zn_{0.7}Mg_{0.3})O$ thin film has a wurtzite type crystal structure, the ZnSe type thin film has a zincblende type crystal structure, and the c axis of the $(Zn_{0.7}Mg_{0.3})O$ thin film and the [111] axis of the ZnSe type thin film were parallel to each other. Namely in this example, the light emitting layer and the electron injection electrode have such relation that the continuity of the crystal lattices is broken, and the crystal-oriented relation. It is obviously understood that they also have no epitaxial relation.

Further, on the light emitting layer, a Cu-doped $Zn_{0.6}M_{0.4}S$ thin film with a carrier concentration of $1\times10^{19}/cm^3$ or more was deposited to 300 nm as the hole injection electrode. Incidentally, On the electron injection electrode and the hole injection electrode, Al electrodes were formed, respectively.

A voltage was applied across the electrodes of the light emitting diode thus formed. As a result, sharp light emission (spectrum half-width 30 nm) occurred at a wavelength of 540 nm, indicating that the light emitting diode of the invention effectively functioned.

INDUSTRIAL AVAILABILITY

As described up to this point, in the invention, substrate materials other than a single crystal substrate, such as a glass substrate, can be used. Therefore, it is possible to fabricate a large device such as a light emitting diode device having dimensions of, for example, 1 square meter or more. For example, it is possible to implement a self-emitting type large display. Further, the glass substrate can be made transparent. Therefore, by forming the light emitting layer and the electrode layers using a similarly transparent wide gap semiconductor, it is possible to implement a see-through display. Further, the glass substrate is not only more inexpensive than a single crystal substrate, but also low in environmental load because $SiO_2$ which is the main component of the glass substrate is nontoxic.

In the invention, a crystalline phase material may be used for the light emitting layer, but an amorphous phase material can be used. In the amorphous phase, no crystal grain boundary is present, and no crystal defect is present, and therefore, non-light emitting recombination of both the carries at the grain boundary or the crystal defect does not occur. For this reason, both the carriers can be introduced into nanocrystals with efficiency. Further, the amorphous phase is uniform in terms of the chemical composition and the structure. In addition, when it is in the form of a film, the surface smoothness tends to be obtained. Therefore, it is possible to form a light emitting device with stable characteristics.

Then, in the invention, nanocrystals with a uniform grain size and a narrow grain size distribution width are dispersed in the light emitting layer. Therefore, it is possible to form a light emitting layer in which quantum dots with a uniform grain size are filled to a high density. In the quantum dots, both the carriers are injected in the quantum dots with efficiency, and are recombined with each other to emit light. Therefore, the luminous efficiency is significantly enhanced due to the quantum effects of quantum dots. This allows the light emitting diode on the glass substrate to exhibit practical luminous intensity.

Further, by selecting the material and the grain size of the quantum dots, it is possible to emit light with a wavelength over a wide region of ultraviolet to infrared with good-monochromatism, and to fabricate a device for emitting RGB three primary colors, or a white light emitting device. Herein, the voltage to be applied to the light emitting diode is determined by the forbidden band width of the ambipolar semiconductor used as the light emitting layer. Therefore, the light emitting diode having a given spectral distribution as with RGB three primary colors or white color can be driven at the same voltage without variations in various characteristics.

In addition, in the invention, an inorganic semiconductor is used as the ambipolar semiconductor. Therefore, it is more resistant to ultraviolet irradiation, and thermally more stable than an organic semiconductor. For this reason, it is suitable for outdoor use, it has a long device life, and it can obtain long term reliability.

The invention claimed is:

1. A quantum dot-dispersed light emitting device comprising:
   a substrate;
   an electron injection electrode;
   a hole injection electrode; and
   an inorganic light emitting layer disposed so as to be in direct contact with both the electrodes,
   wherein the inorganic light emitting layer
   includes an ambipolar inorganic semiconductor material and nanocrystals constituting a quantum dot dispersed as luminescent centers in the ambipolar inorganic semiconductor material in which coating materials for coating surfaces of the nanocrystals are eliminated from the surfaces of the nanocrystals, and
   is configured without having, at the interface with the electron injection electrode and/or the hole injection electrode, epitaxial relation therewith.

2. The quantum dot-dispersed light emitting device according to claim 1,
   wherein the ambipolar inorganic semiconductor material is an amorphous semiconductor phase.

3. The quantum dot-dispersed light emitting device according to claim 1,
   wherein the ambipolar inorganic semiconductor material is a polycrystal semiconductor phase.

4. The quantum dot-dispersed light emitting device according to claim 1
   wherein the inorganic light emitting layer comprises a ZnS type semiconductor phase.

5. The quantum dot-dispersed light emitting device according to claim 4,
   wherein the inorganic light emitting layer comprises $Zn_pM_{1-p}S_xSe_yTe_{1-x-y}$ (where $0 \leq x, y, x+y \leq 1, 0 < p \leq 1$, M: alkaline-earth metal, Cd).

6. The quantum dot-dispersed light emitting device according to claim 4,
   wherein the nanocrystals constituting a quantum dot contain any of InP, GaAs, and GaP as a main component.

7. The quantum dot-dispersed light emitting device according to claim 1,
   wherein the hole injection electrode comprises Cu-doped $Zn_pM_{1-p}S_xSe_yTe_{1-x-y}$ (where $0 \leq x, y, x+y \leq 1, 0 < p \leq 1$, M: alkaline-earth metal, Cd).

8. The quantum dot-dispersed light emitting device according to claim 1,
   wherein the substrate is a glass substrate.

9. The quantum dot-dispersed light emitting device according to claim 1,
   wherein the electron injection electrode and the hole injection electrode are disposed spaced apart from each other, with the inorganic light emitting layer interposed therebetween, in a lamination on the substrate.

10. The quantum dot-dispersed light emitting device according to claim 1,
    wherein the electron injection electrode and the hole injection electrode are disposed spaced apart from each other in a plane on the substrate.

11. The quantum dot-dispersed light emitting device according to claim 1,
    wherein a gate electrode is disposed between the electron injection electrode and the hole injection electrode.

12. A display apparatus comprising the quantum dot-dispersed light emitting device according to claim 1.

13. An illumination device comprising the quantum dot-dispersed light emitting device according to claim 1.

* * * * *